(12) United States Patent
Blasco et al.

(10) Patent No.: US 11,830,901 B2
(45) Date of Patent: Nov. 28, 2023

(54) OPTICAL SYSTEM INCLUDING A MICROLENS ARRAY

(71) Applicant: PHOTONIC SENSORS & ALGORITHMS, S.L., Paterna (ES)

(72) Inventors: Jorge Blasco, Paterna (ES); Ivan Virgilio Perino, Paterna (ES); Leticia Carrión, Paterna (ES); Javier Grandia, Paterna (ES); Francisco Alventosa, Paterna (ES)

(73) Assignee: PHOTONIC SENSORS & ALGORITHMS, S.L., Paterna (ES)

( * ) Notice: Subject to any disclaimer, the term of this patent is extended or adjusted under 35 U.S.C. 154(b) by 0 days.

(21) Appl. No.: 18/042,928

(22) PCT Filed: Jan. 16, 2021

(86) PCT No.: PCT/EP2021/050880
§ 371 (c)(1),
(2) Date: Feb. 24, 2023

(87) PCT Pub. No.: WO2022/128163
PCT Pub. Date: Jun. 23, 2022

(65) Prior Publication Data
US 2023/0317755 A1 Oct. 5, 2023

(30) Foreign Application Priority Data
Dec. 15, 2020 (ES) .............................. ES202031247

(51) Int. Cl.
*H01L 27/146* (2006.01)
(52) U.S. Cl.
CPC .. *H01L 27/14627* (2013.01); *H01L 27/14618* (2013.01)

(58) Field of Classification Search
CPC ................... H01L 27/14627; H01L 27/14618
See application file for complete search history.

(56) References Cited

U.S. PATENT DOCUMENTS 8,290,358 B1 10/2012 Georgiev
2008/0043127 A1 2/2008 Mochizuki et al.
(Continued)

FOREIGN PATENT DOCUMENTS

JP 2017158148 A 9/2017

OTHER PUBLICATIONS

International Search Report and Written Opinion for Corresponding International Application No. PCT/EP2021/050880, 8 pages, dated Aug. 2, 2021.
(Continued)

*Primary Examiner* — Jonathan Han
(74) *Attorney, Agent, or Firm* — LUCAS & MERCANTI, LLP

(57) ABSTRACT

An optical system (400) including a microlens array (104), an image sensor (108) and a PCB (206). The microlens array (104) is bonded to the image sensor (108) with glue lines (804) or glue drops (802) dispensed around the non-active area (404) of the microlens array (104). The image sensor (108) may be bonded to the PCB (206) with a layer of adhesive material (502) applied only on a central region of the image sensor (108). Alternatively, the image sensor can rest onto a thermally conductive resin layer (109) placed over a stiffener (207), and the image sensor can be attached to the PCB (206) by one or more glue drops (111) or glue lines (113) arranged on at least one side of the image sensor (108) or by an adhesive layer (115) laterally surrounding the image sensor (108). The optical system (400) solves the problem of misalignment between the image sensor and the microlens array caused by changes in temperature.

19 Claims, 29 Drawing Sheets

(56) References Cited

U.S. PATENT DOCUMENTS

| | | | |
|---|---|---|---|
| 2010/0053407 A1* | 3/2010 | Crisp | H01L 24/14 |
| | | | 257/E31.097 |
| 2015/0077625 A1* | 3/2015 | Ferraris | H01L 27/14627 |
| | | | 348/373 |
| 2015/0288861 A1 | 10/2015 | Duparré | |
| 2016/0005778 A1* | 1/2016 | Jun | H01L 27/14618 |
| | | | 257/434 |

OTHER PUBLICATIONS

International Preliminary Report on Patentability for Corresponding International Application No. PCT/EP2021/050880, 12 pages, dated Dec. 2, 2022.

* cited by examiner

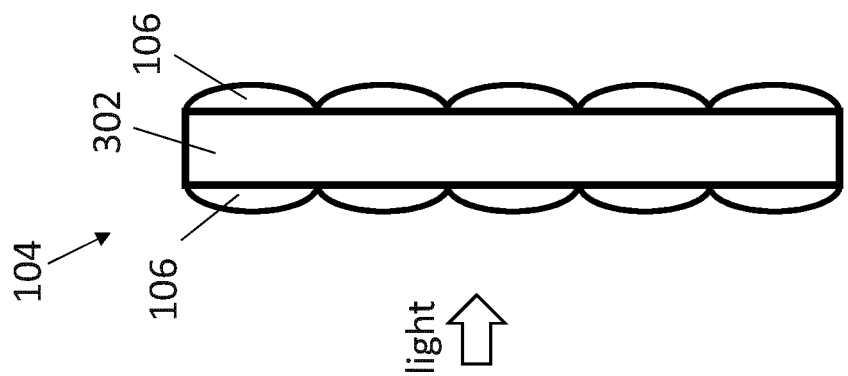
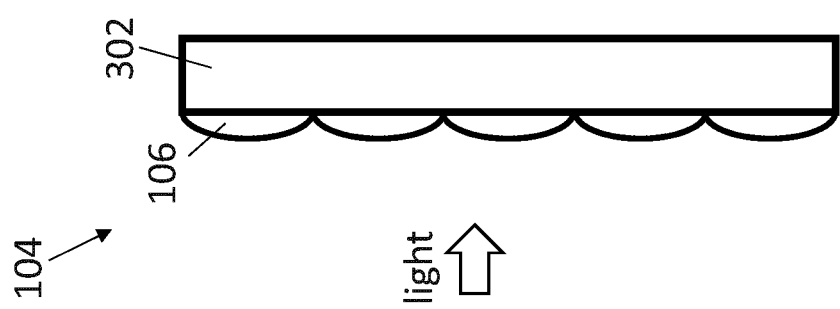
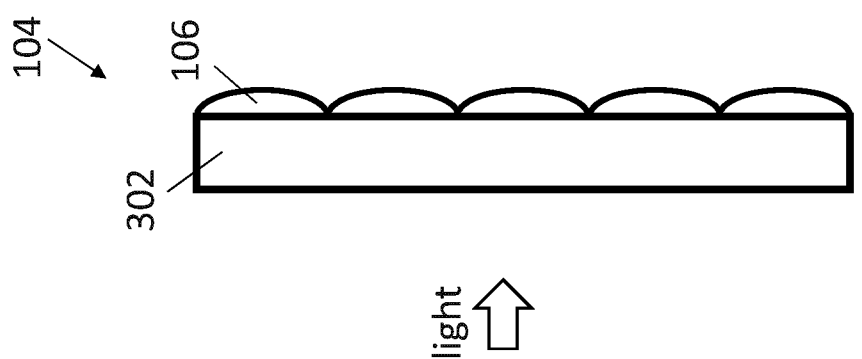

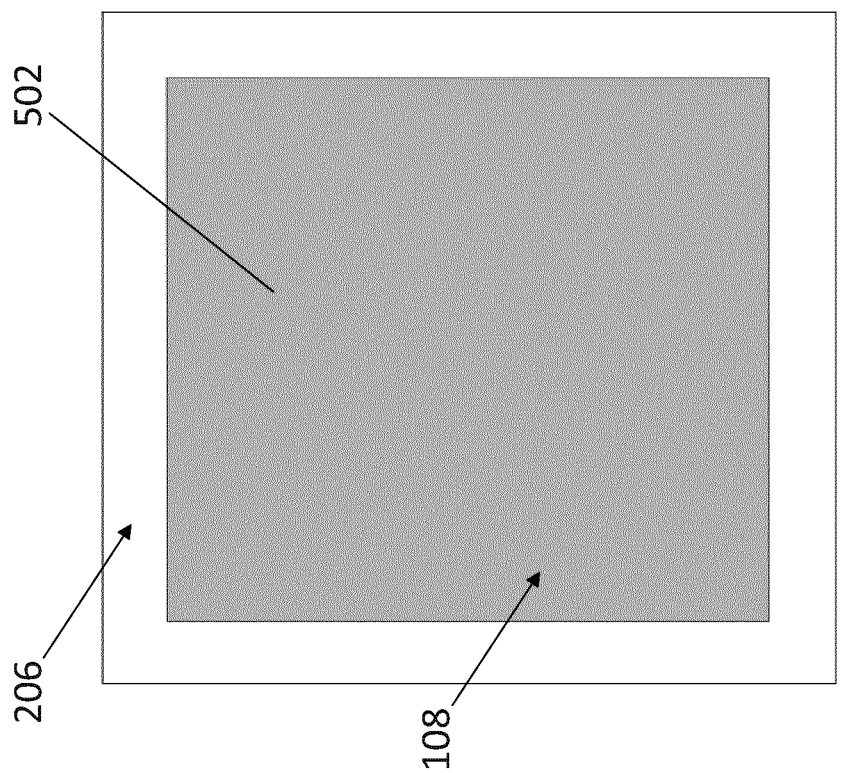

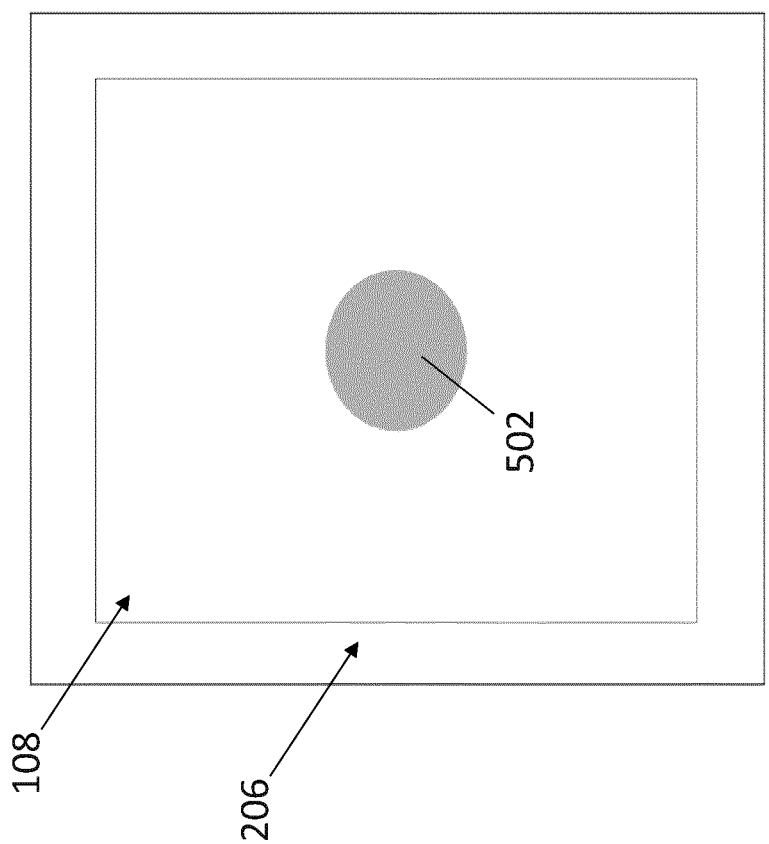

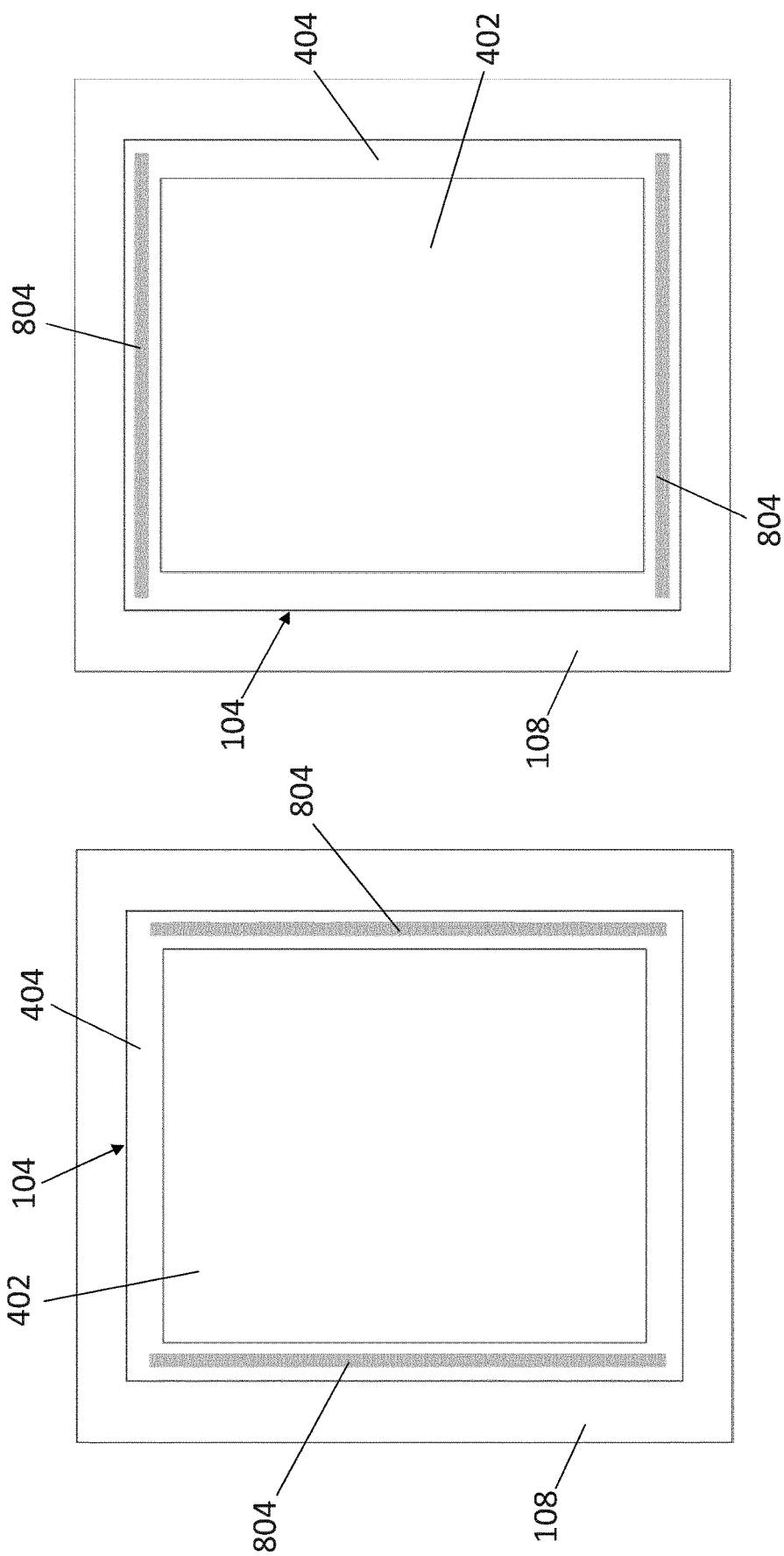

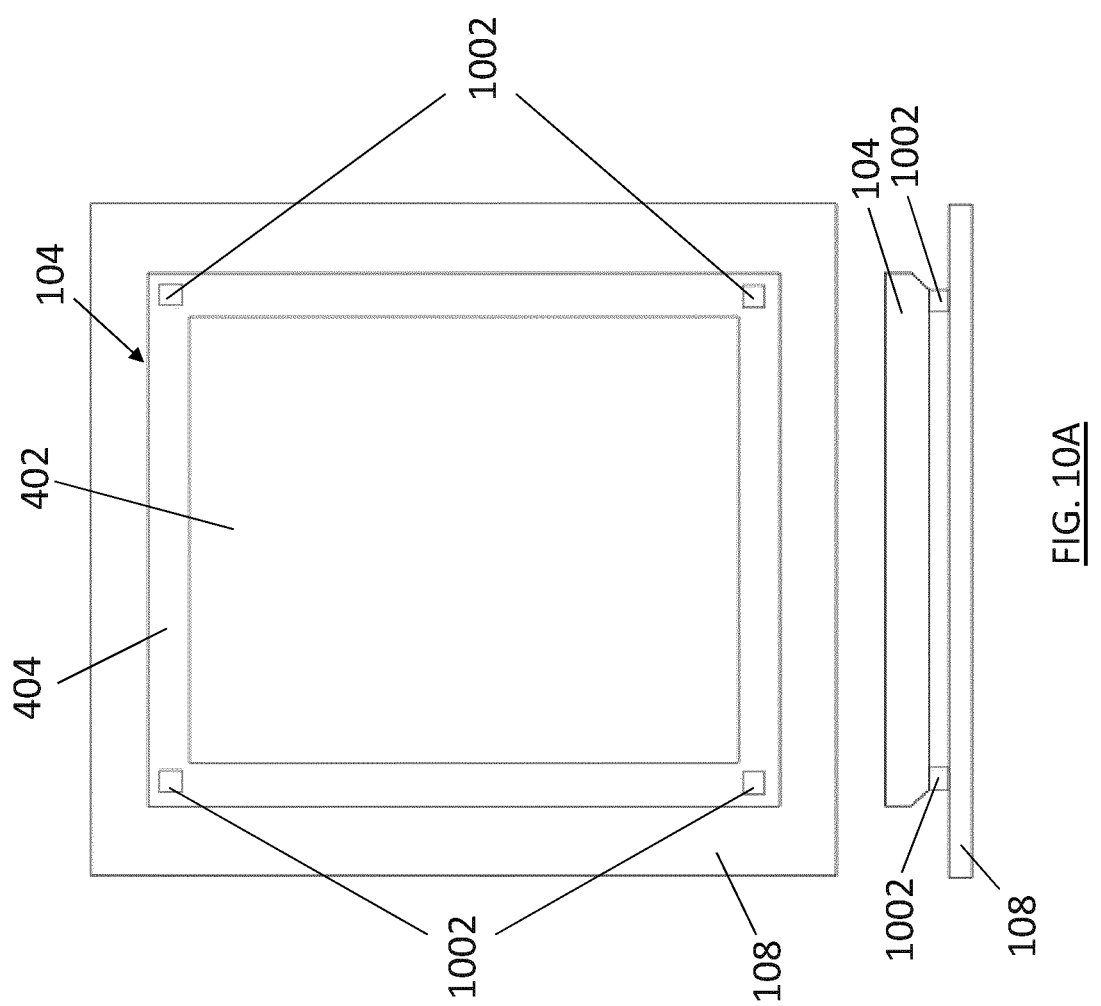

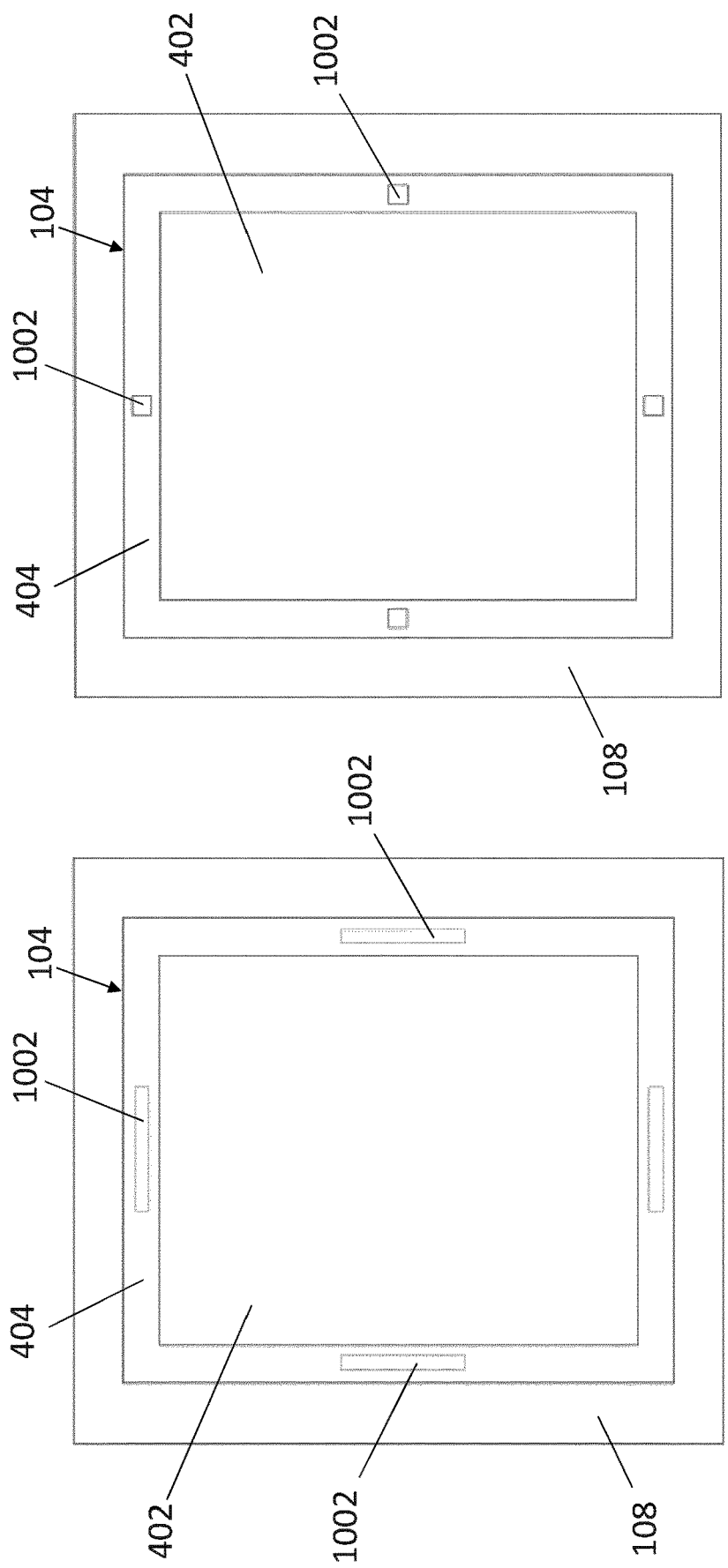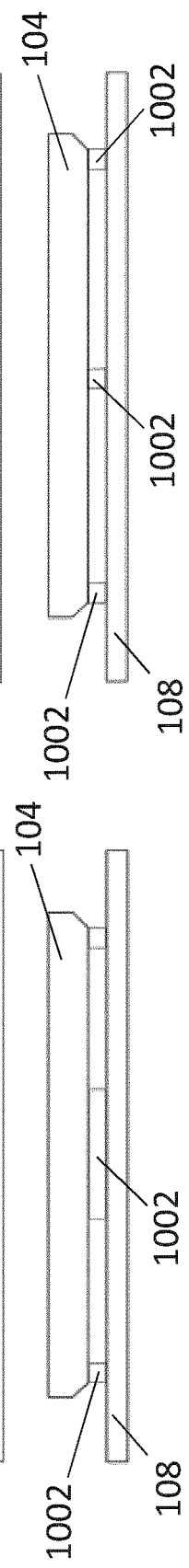
FIG. 10B
FIG. 10C

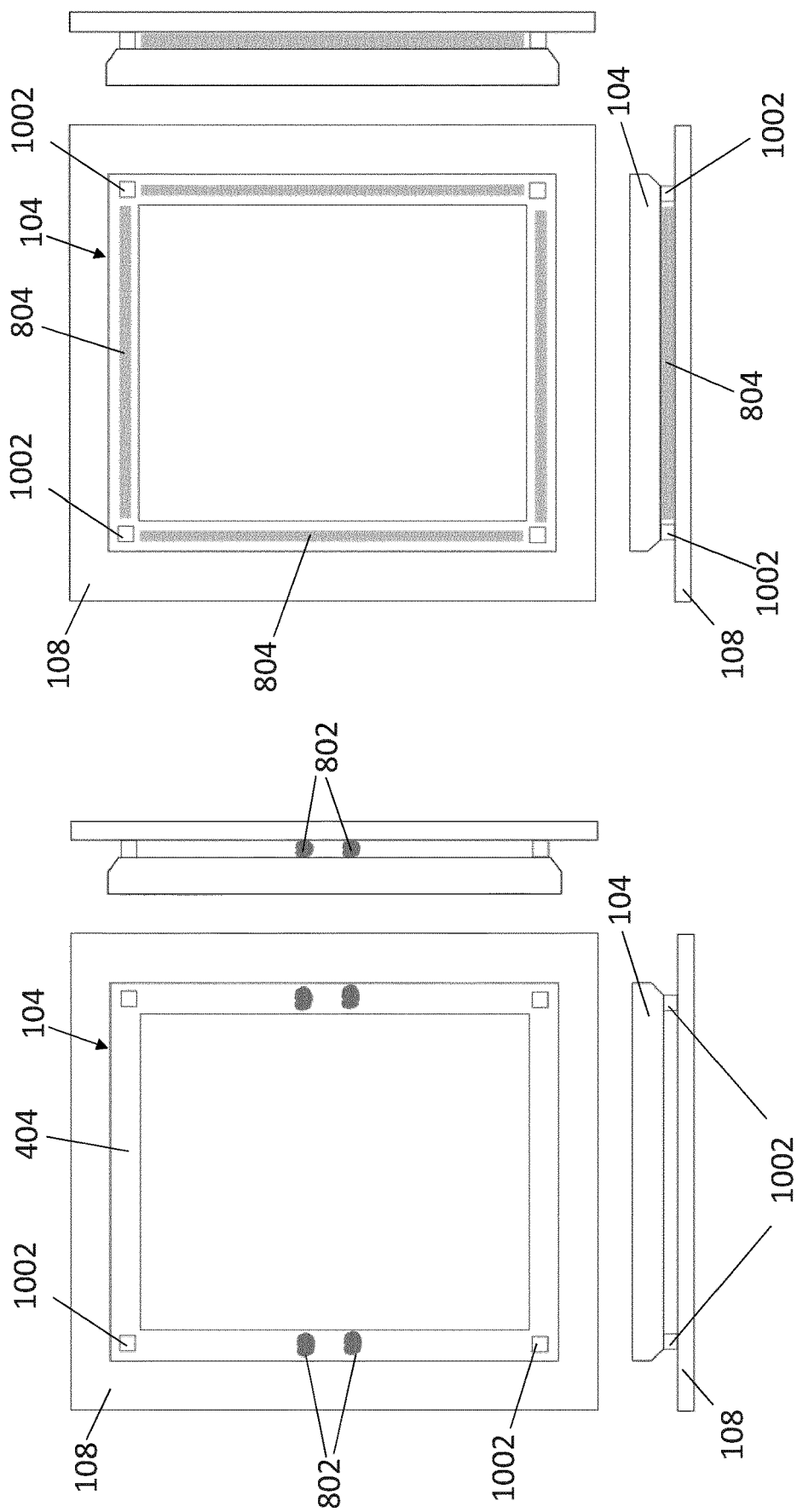

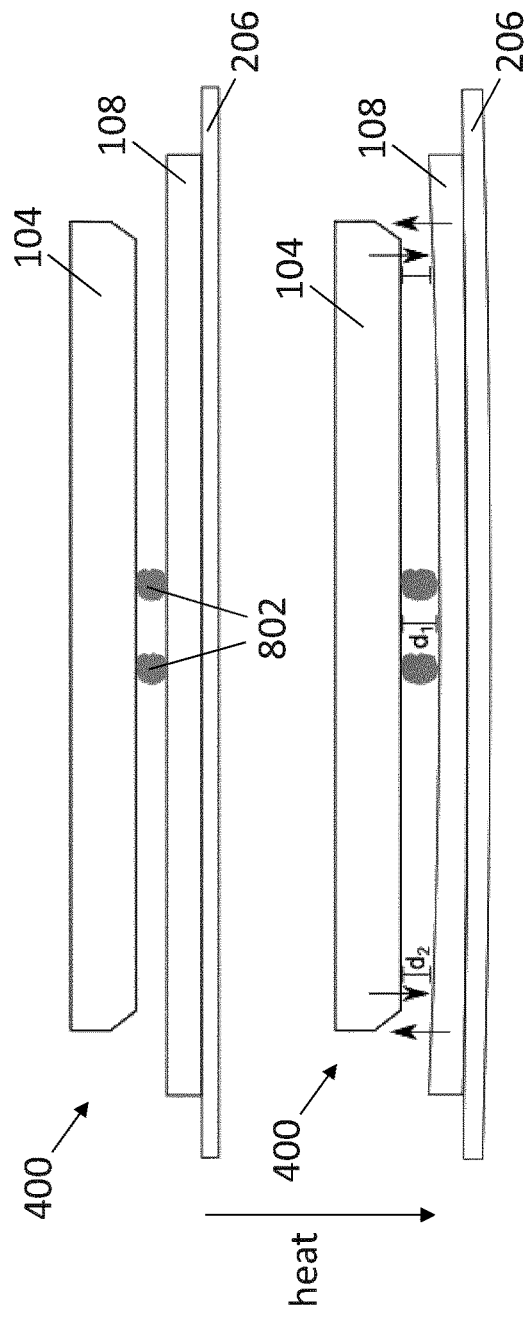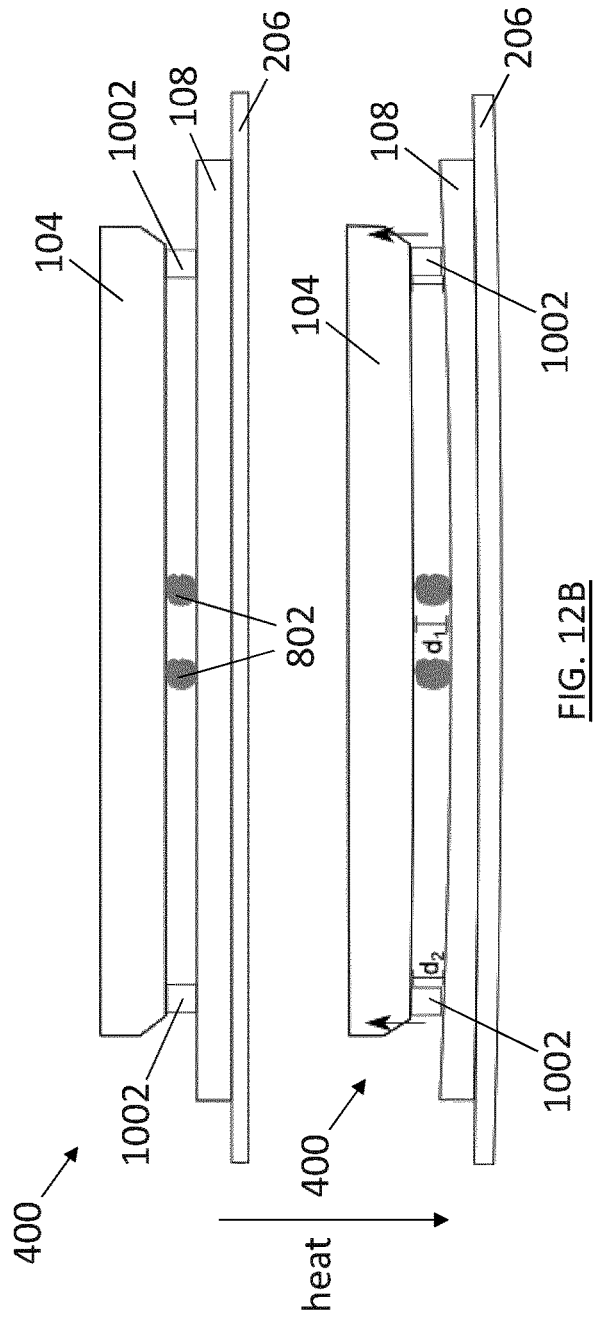

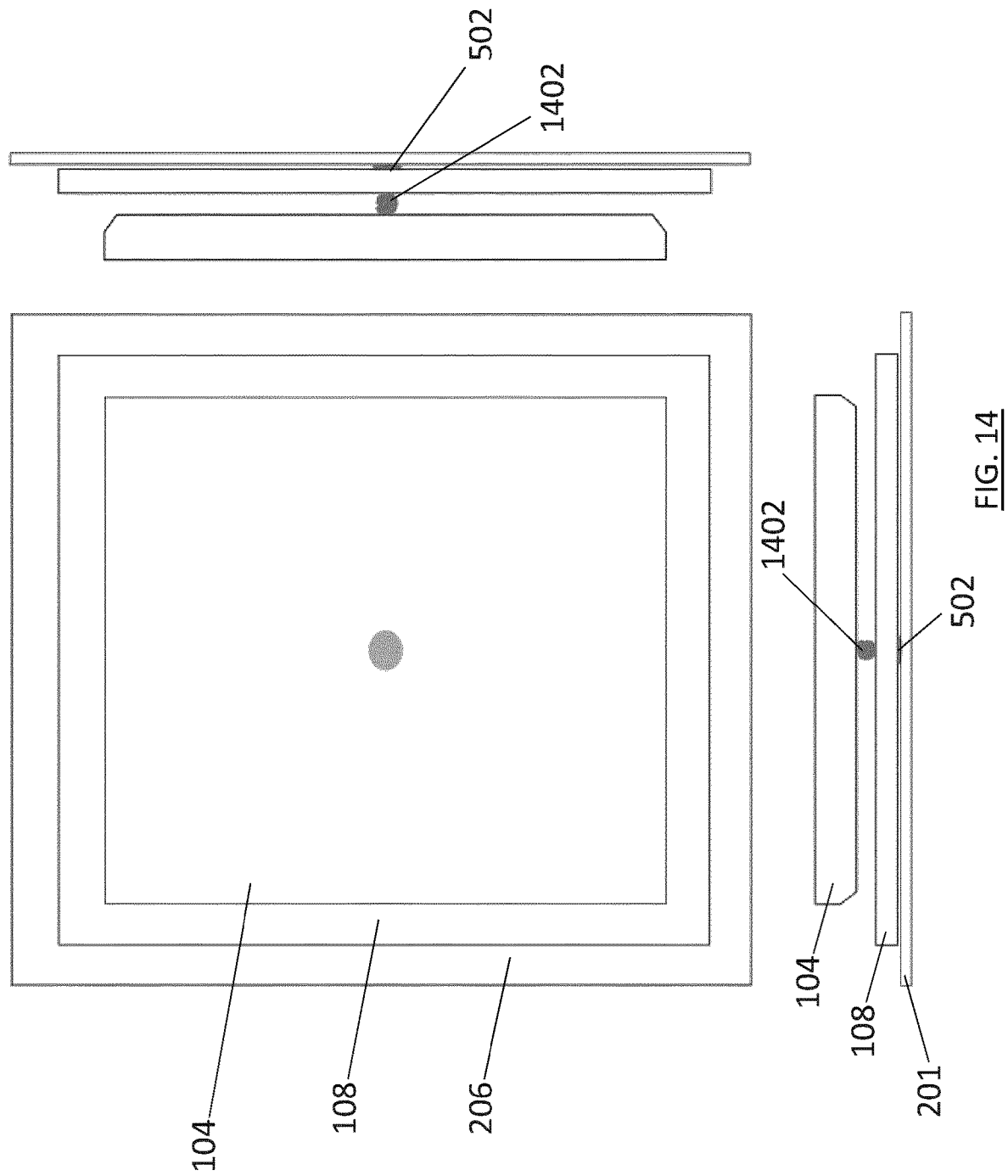

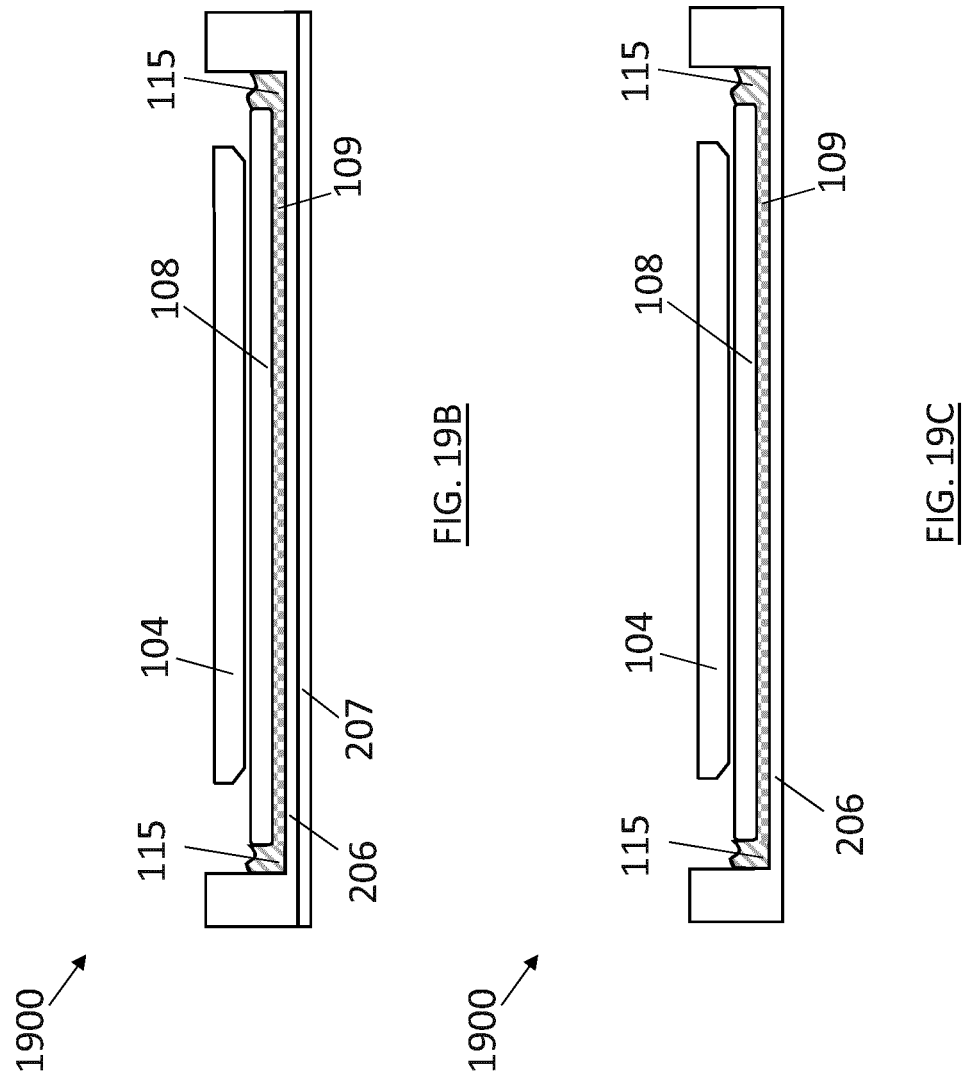

OPTICAL SYSTEM INCLUDING A MICROLENS ARRAY

CROSS-REFERENCE TO RELATED APPLICATIONS

This application is a 371 of PCT/EP2021/050880, filed Jan. 16, 2021, which claims the benefit of Spanish Patent Application No. P202031247, filed Dec. 15, 2020, each of which are incorporated herein by reference.

TECHNICAL FIELD

The present invention is comprised in the field of microlens arrays, optical systems incorporating microlens arrays, light field images, and light field cameras.

BACKGROUND ART

Microlens arrays are common elements in micro-optical structures with a wide number of applications, especially in the fields of imaging and illumination. In the area of light-field devices, such as plenoptic cameras, microlens arrays play an important role.

Plenoptic cameras are imaging devices capable of capturing not only spatial information but also angular information of a scene. This captured information is known as light-field (LF), which can be represented as a four-dimensional tuple $LF(px,py,lx,ly)$, where px and py select the direction of arrival of the rays to the image sensor and lx,ly are the spatial position of these rays. A plenoptic camera is typically formed by a microlens array placed in front of an image sensor.

In a plenoptic camera, a perfect parallel alignment between the microlens array and the image sensor is extremely important. Tight tolerances need to be reached, otherwise the optical system will not work properly. Or, instead, a huge amount of calibration data is required to be stored in the camera to make the optical system work properly.

The problem of misalignments between the image sensor and the microlens array can have a wide variety of causes. The most evident one is a bad mechanical alignment between the two components. The way the microlens array is attached to the image sensor (directly glued, using a holder, etc.) can be the cause of misalignments, especially if mechanical stresses are introduced into the system.

In addition, the image sensor is attached to a printed circuit board (PCB), or to a substrate or a stiffener which is in turn attached to the PCB. The way the image sensor is attached to the PCB or to the stiffener may also influence the warpage of the image sensor, especially under mechanical stresses.

Another source of problems that can result on misalignments is the different thermal expansion coefficients between the stiffener (and/or the PCB), the image sensor and the microlens array, since the different coefficients of thermal expansion depend directly on the different materials of these components.

All these problems may negatively affect, either individually or in conjunction, the perfect parallel alignment between the microlens array and the image sensor, notably damaging the performance of the camera. In fact, the problems of mechanical misalignment, warpage of the image sensor, the PCB, the stiffener and the different thermal expansions of the several materials composing the camera need to be considered all at the same time, as the mechanical alignment depends on the way the microlens array and the image sensor are attached together, and this also depends on how the materials expand and contract with temperature.

The problem of final misalignments between the microlens array and the image sensor becomes more delicate as the system is miniaturized, because tighter tolerances need to be respected. The best possible mechanical alignment, as insensitive as possible to temperature changes, needs to be reached.

This problem has already been noted in the prior art. For example, patent document U.S. Pat. No. 8,290,358-B1 deals with misalignments caused by different thermal shifts, but no solution is actually presented in the document. Patent document US20150288861-A1 discloses a case wherein the warpage of the image sensor generates imprecisions in the optical system, trying to compensate them by introducing warpage in the lens stack array, but this solution is not optimal in terms of parallel alignment and is very dependent on temperature oscillations.

An optical system that solves the afore mentioned problems of misalignments between the image sensor and the microlens array caused by thermal shifts is therefore necessary.

SUMMARY OF INVENTION

The present invention refers to an optical system with a microlens array and a miniaturized plenoptic camera including methods which that solve, or at least reduce, the misalignments between the image sensor and the microlens array, especially those caused by changes in temperature.

The optical system includes a structure of a microlens array attached to an image sensor, which in turn is attached to a PCB either directly or through a substrate or a stiffener, wherein the misalignments between the microlens array and the image sensor have been reduced to avoid storing complex calibration information about the relative position of both components and their possible variations with temperature.

In the optical system, the microlens array is directly bonded to the image sensor using an adhesive, a glue or a foam. This substance can be dispensed around the non-active area of the microlens array forming a set of/a pattern of dots or lines between the image sensor and the microlens array. The glue can also be dispensed as drops in the four corners of the array or on the lateral sides of the microlens array. The glue can be dispensed over the microlens array, over the image sensor, or at the air gap between both components. The adhesive material of the glue drops or lines is preferably thermally conductive In an embodiment, the image sensor is bonded to the PCB with a layer of adhesive material, preferably thermally conductive, applied only on a central region of the base of the image sensor, the region occupied by the adhesive material extending preferably to a surface lower than a 10% of the total area of the image sensor, with its origin at the center of the image sensor. In another embodiment, the image sensor is bonded to the PCB with an elastic adhesive material applied on at least one of the lateral sides of the image sensor (108).

In another embodiment, the system comprises a resin layer placed between the base of the image sensor and the printed circuit board (which in turn may have a stiffener attached at its bottom) or between the base of the image sensor and a stiffener (which in turn is attached to the printed circuit board), and the image sensor is bonded to the printed circuit board with at least one glue drop or glue line (preferably made of an elastic adhesive material) applied on at least one lateral side of the image sensor or with an adhesive layer applied on one or more lateral sides of the image sensor (preferably applied on all the lateral sides). The adhesive material of the glue drop(s), glue line(s) or the adhesive layer is preferably thermally conductive.

In an embodiment, the image sensor is bonded to the printed circuit board with a glue drop applied on a single lateral side of the image sensor, and a resin layer placed (but not glued) between the base of the image sensor and the PCB or a stiffener attached to the PCB. This structure guarantees a more free displacement of the PCB vs. the stiffener and the image sensor caused by thermal expansion and contraction whilst avoiding unnecessary mechanical stresses to the image sensor or the other components since it is mechanically fixed to the system on only one point, the single glue drop.

In another embodiment, the image sensor is bonded to the printed circuit board with a plurality of glue drops or glue lines applied on a plurality of the lateral sides of the image sensor, and preferably using two or more glue lines applied on opposite lateral sides of the image sensor.

In yet another embodiment, the image sensor is bonded to the printed circuit board with a highly elastic adhesive layer applied on the lateral sides of the image sensor, and a resin layer is laid (not glued) between the base of the image sensor and the PCB or a substrate or a stiffener attached to the PCB. The elasticity of the adhesive layer is high enough to guarantee an elastic reaction to the expansions and contractions caused by temperature variations to the PCB and all the other components of the camera. This elastic reaction will prevent any displacement of the sensor relative to its initial position by neutralizing the mechanical forces from any different X-Y plane direction.

In an embodiment, the glass substrate in which the microlenses are built is made of a material whose coefficient of thermal expansion (CTE) matches the CTE of the image sensor with a maximum difference of $\Delta = 3 \times 10^{-6} K^{-1}$.

In an embodiment, the optical system includes supporting blocks which are built in the non-active area of the microlens array, preferably with the same glass or polymer material. The blocks are arranged to support the microlens array, ensuring an easier alignment in the Z direction (direction perpendicular to the image sensor) whilst limiting the tilts around X and Y axes (pitch and roll), contributing also to keep the parallelism between the microlens array and the image sensor.

The optical system of the present invention can be integrated into a plenoptic camera or a plenoptic mini-camera to be used in an electronic mobile device. The electronic mobile device can be, for instance, a smartphone, a tablet, a laptop or a compact camera, among others. It can also be a device to be used in IoT applications, AR/VR applications or any other camera application. Another aspect of the present invention refers to a plenoptic camera for portable devices, wherein the plenoptic camera comprises the optical system previously described.

For the description of the present invention the following definitions and acronyms will be considered:

Microlens array or MLA: a plurality of lenslets (microlenses) arranged in an array.

Lenslet or microlens: each small lens forming a microlens array.

Plenoptic camera: device that captures not only the spatial position but also the direction of arrival of the incident rays.

LF: Light field, four-dimensional structure LF (px, py, lx, ly) that contains information of the light captured by the pixels (px, py) below the microlenses (lx, ly) in a plenoptic camera.

CTE (α): Linear coefficient of thermal expansion of a material, also referred as a.

Fillers: Compounds that are part of the adhesive/glue and have the objective to vary or determine some physical and mechanical properties of the adhesive. They contribute to lower the rate of shrinkage of the glue.

Sx, Sy: Image sensor dimension in X and Y directions.

Sz: Thickness of the image sensor.

Mx, My: Dimension of the active area of the microlenses in the X and Y directions.

GSx, GSy: Dimension of the substrate area of the microlenses in the X and Y directions.

GSz: Glass substrate thickness.

IR Filter: Optical element which blocks IR light and prevents IR light from impinging over the sensor.

PCB: Printed Circuit Board.

Stiffener: Rigid plate which gives mechanical stability and stiffness.

BRIEF DESCRIPTION OF DRAWINGS

A series of drawings which aid in better understanding the invention and which are expressly related with embodiments of said invention, presented as non-limiting examples thereof, are briefly described below.

FIGS. 3A, 3B and 3C depict three possible embodiments of microlens arrays, with microlenses 106 built at the bottom side of the array (FIG. 3A), at the top side of the array (FIG. 3B) or at both sides of the array (FIG. 3C).

FIG. 5 depicts the image sensor attached to the PCB by a layer of adhesive covering the whole area of the image sensor, according to prior art.

FIG. 6 depicts an image sensor glued to a PCB only on a central region, according to an embodiment of the present invention.

FIGS. 8A-8F show, according to different embodiments of the present invention, a top view of the microlens array attached to the image sensor by means of gluing.

FIG. 10A-10C show several examples arrangements of a microlens array and an image sensor with blocks arranged between both components, in the non-active area of the microlens array.

FIGS. 11A-11B depicts top, front and lateral views of an arrangement of a microlens array and an image sensor, with four columns built in the non-active area of the microlens array, and with glue drops or glue lines dispensed to attach both parts at each long side on the non-active area of the microlens array and the image sensor (FIG. 11A) or covering the whole perimeter of the microlens array (FIG. 11B).

FIG. 12A shows an example of how the heat can produce misalignments between the image sensor and the microlens array. FIG. 12B shows how the inclusion of supporting blocks helps to maintain the parallelism between the microlens array and the image sensor.

FIG. 14 shows top, front and lateral views of an arrangement where the image sensor is attached to the PCB with glue by its center, and the microlens array is attached to the image sensor also with glue by its center, so all components can expand freely around the central point when the temperature is increased.

FIGS. 19B and 19C show different embodiments with or without a stiffener.

DETAILED DESCRIPTION

Figure 1:
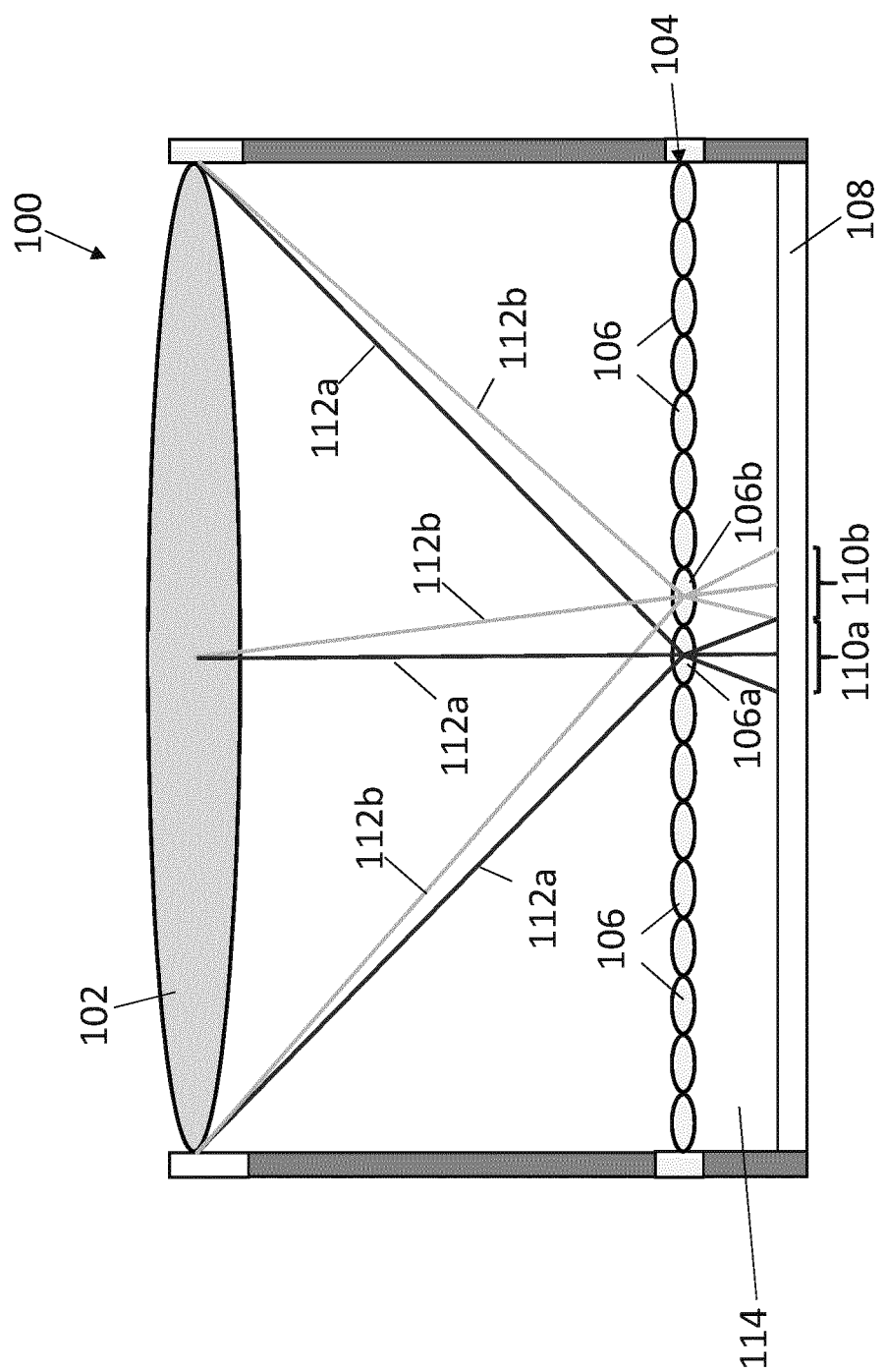
FIG. 1 represents a schematic of a basic plenoptic camera according to the prior art, including a main lens, a microlens array and an image sensor.

A plenoptic camera 100 according to the prior art, as depicted in schematic representation of FIG. 1, commonly integrates a main lens 102 (usually an upper barrel of optical components or a set of lenses equivalent to said main lens 102), a plurality of microlenses 106 arranged in a microlens array 104, an image sensor 108. The system is a pupil imaging system, wherein each microlens 106 of the microlens array 104 forms an image of the main aperture of the main lens 102 of the plenoptic camera over a small area (microimages 110a and 110b) of the image sensor 108.

FIG. 1 shows two bunches of rays (112a, 112b) crossing the main aperture 102 of the plenoptic camera 100 and reaching a central microlens 106a and an adjacent microlens 106b in the microlens array 104, respectively. Each bunch of rays (112a, 112b) produces a different microimage (110a, 110b) over the image sensor 108. The microlens array 104 is aligned parallel to the image sensor 108, separated by an air gap 114 of several tens of microns.

Figure 2:
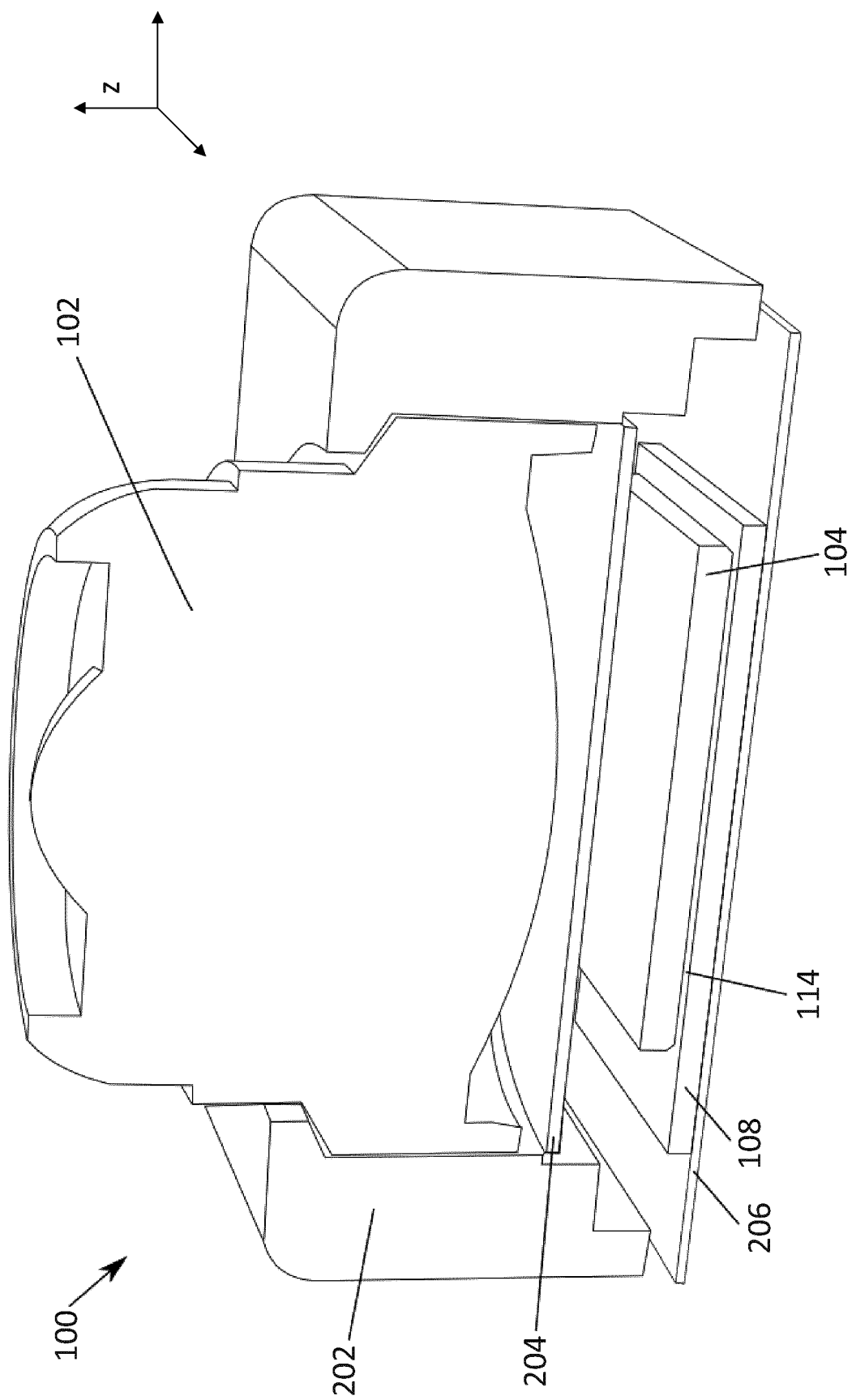
FIG. 2 shows a cross-cut schematic view of a more realistic plenoptic camera of the prior art, where the main lens is composed by a barrel of lenses within a holder.

FIG. 2 shows a more realistic embodiment of the plenoptic camera 100 of FIG. 1. In this figure, the main lens 102 is a barrel of several lenses (not shown) which is in turn inserted into a holder 202. The main lens 102 and the holder 202 may be a single piece or two separated pieces. A filter 204, which is commonly an IR filter, blocks the infrared light of the spectrum. The image sensor 108 is electronically connected to a printed circuit board, PCB 206.

The microlens array 104 is formed (see FIGS. 3A-3C) by a glass substrate 302 (which provides consistency) and the microlenses 106 themselves. The microlenses 106 can be made with polymer deposited over the glass substrate 302, but they also may be built only in glass. In particular, the microlenses 106 can be manufactured by micro-optical etching of glass (the same glass as the substrate 302), micro-built in polymer over the glass substrate or micro-printed with inkjet polymers or other micro-optic techniques. The microlens array 104 is attached to the image sensor 108, and the sensor 108 is in turn attached to the PCB 206, either directly or through a stiffener (not shown in FIGS. 3A-3C).

As shown in FIGS. 3A-3C, the microlenses 106 can be built either at the bottom side of the glass (FIG. 3A), at the upper side of the glass (FIG. 3B) or at both sides of the glass substrate 302 (FIG. 3C). The embodiments described in the following examples are intended to be examples, not limiting implementations. Note that FIGS. 3A-3C are not drawn at scale, the thickness of substrate 302 of the microlens array 104 is normally between 200 and 500 µm, while the sagitta of the microlens 106 is only a few microns (should it be drawn to scale, it would look as the flat surface shown in FIG. 2). If the microlenses 106 are made with polymer on glass, the thickness of the polymer is around 50 µm or below.

Figure 4A:
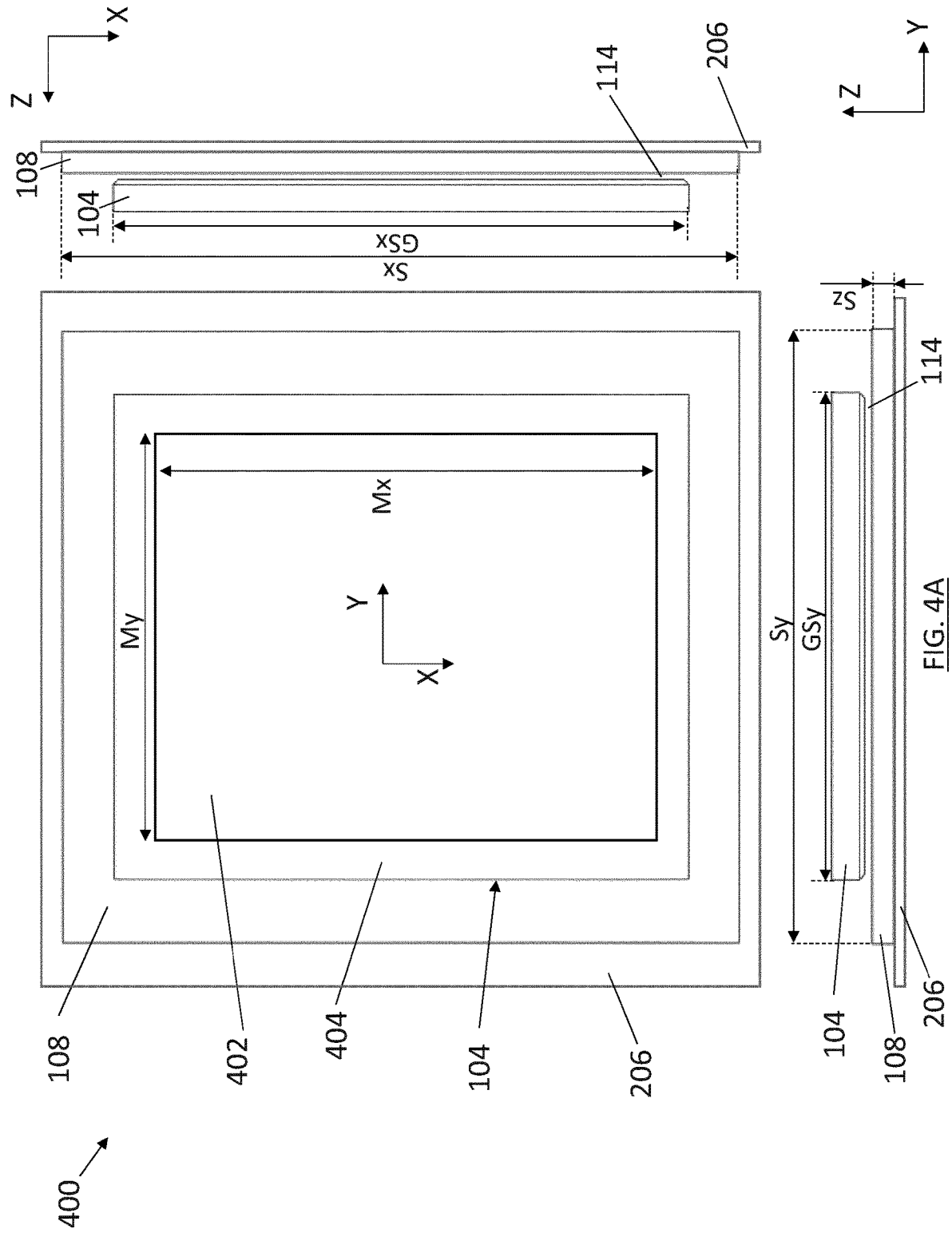
FIGS. 4A and 4B show top, lateral and front views of the microlens array, the image sensor and the PCB, without a stiffener (FIG. 4A) or with a stiffener (FIG. 4B), of an optical system installed in a plenoptic camera.

FIG. 4A shows a schematic of an optical system 400 comprising the microlens array 104, the sensor 108 and the PCB 206 seen from above, the right lateral side and the front side. The cartesian axes (X, Y, Z) are shown in the figure.

In an ideal arrangement, the microlens array 104 is aligned completely parallel to the front surface of the image sensor 108, separated by an air gap 114 of several tens of microns, both elements aligned in parallel with each other. The microlens array 104 has an active optical area 402 of dimensions Mx×My where the microlenses 106 are built, but the microlens array 104 extends up to a non-active area 404 (non-optically active area) with a size of dimensions GSx× GSy. Mx, My, GSx and GSy are in the order of about several mm. There is about 200 µm of non-active area 404 at each side, (GSx−Mx)/2 and (Gsy−My)/2, of the microlens array 104 (which is the outside part of the substrate 302 not populated with microlenses 106). The non-active area 404 of the microlens array 104 is used to attach the microlens array 104 to the image sensor 108 with glue and/or a mechanical structure.

The image sensor 108 has a die size of Sx×Sy, in the order of several mm. The thickness Sz of the image sensor 108, which is typically built in silicon, is around 100 to 300 µm. The base (i.e. lower surface) of the image sensor 108 is glued to a PCB 206, either directly (FIG. 4A) or through a stiffener 207 (FIG. 4B), with a thickness preferably between 100-200 µm, which gives mechanical stability to the structure.

The glue and the way the image sensor 108 is glued to the PCB 206 or the stiffener have an impact in the final warpage of the image sensor 108, which needs to be considered when aligning and attaching the microlens array 104.

FIG. 5 depicts the gluing of the image sensor 108 to the PCB 206 (or the stiffener) using a layer of adhesive material 502 (represented in grey colour) covering the whole area of the back surface of the image sensor 108, as commonly performed in the prior art.

FIG. 6 represents, according to an embodiment of the present invention, the image sensor 108 bonded to the PCB 206 with a layer of adhesive material 502 applied only on a central region of the base of the image sensor 108. The image sensor 108 may be bonded to the PCB 206 either directly or through a stiffener; i.e., the layer of adhesive material 502 may be applied to glue the PCB 206 and the image sensor 108 together, or to glue the stiffener 207 and the image sensor 108 together (in that case, the stiffener 207 is in turn attached to the PCB 206 by any means, such as thermal bonding or pressure sensitive adhesives. It must be considered that the shape of the glued area can encompass any known shape and does not have to be limited to a circular one, as shown in this figure.

In an embodiment, the central region where the layer of adhesive 502 is applied extends to a surface substantially centered on the image sensor 108 and occupying an area equal or lower than a 10% of the total area of the image sensor 108.

Considering the image sensor 108 is made mainly of silicon (with a thermal coefficient $\alpha_1$), and the PCB 206 or the stiffener is made of a metallic alloy or other alloys with thermal coefficient $\alpha_2$, and that $\alpha_1 \neq \alpha_2$, the adhesion of both materials introduce warpages as they linearly expand differently with the temperature. In the embodiment of FIG. 6 the image sensor 108 has more freedom to expand with temperature, introducing a lower amount of warpage in comparison with the known gluing techniques of FIG. 5 used in prior art. This reduction in warpage in turn improves the overall alignment between the microlens array 104 and the image sensor 108.

Figure 7:
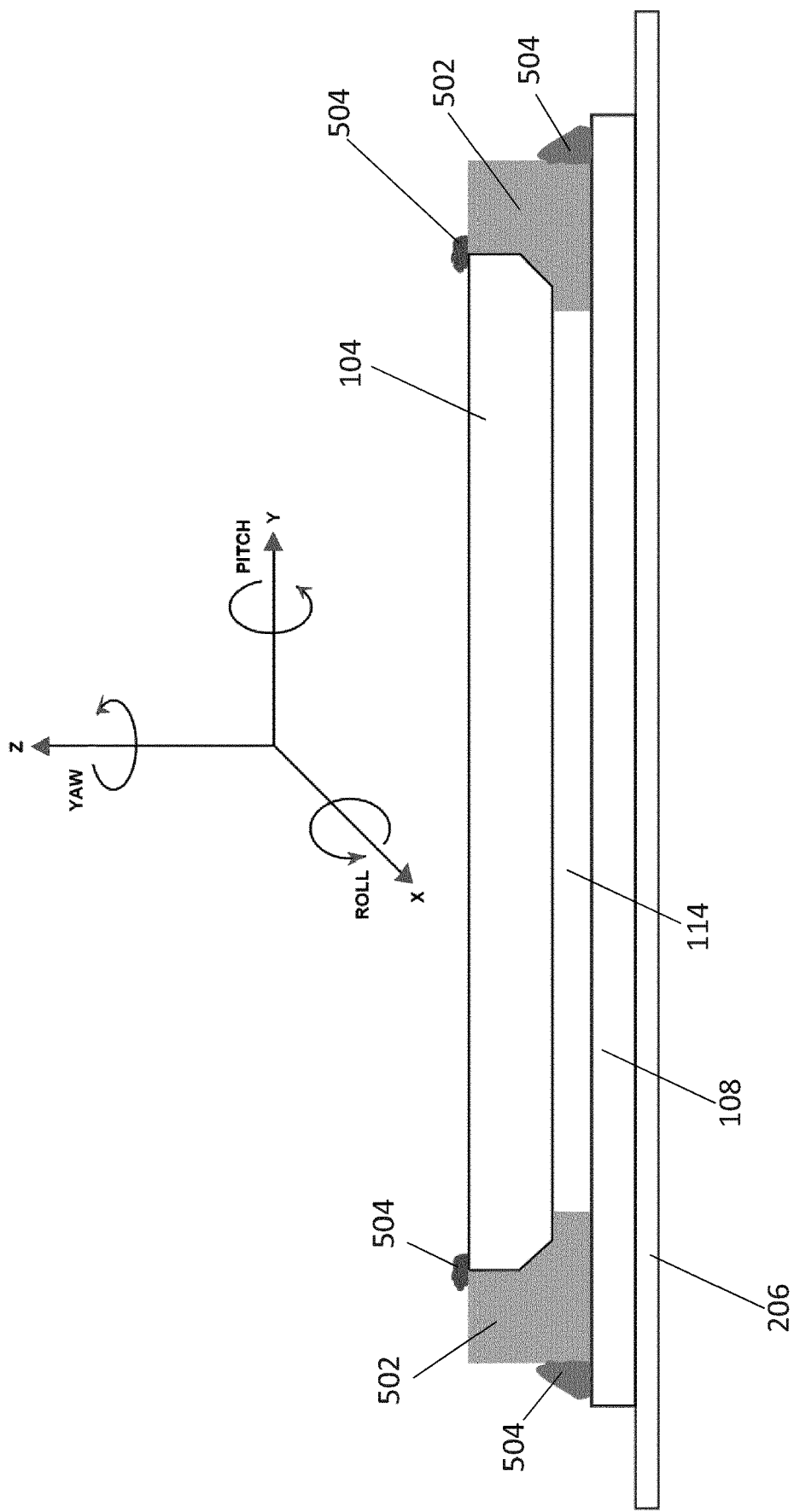
FIG. 7 shows, according to the prior art, a holder structure used for attaching the microlens array to the image sensor.

As previously explained, to achieve the best performance in the light field acquisition and processing, the microlens array 104 should be fixed completely parallel to the sensor at a distance of several microns away from the sensor, aligned in six axes (X, Y, Z, roll, pitch and yaw). According to the prior art, a mechanical structure can be used to hold the microlens array 104 and contribute in the alignment by providing mechanical stability in several axes. In FIG. 7, the microlens array 104 is inserted into a holder 502 designed with high precision tolerances. In this case, the Z axis and roll and pitch angles (angles of rotation around the X and Y axes, respectively) are correctly aligned because the holder 502 ensures this alignment. Once the other three axes are aligned, the holder 502 (which supports the microlens array 104) is bonded to the non-active area of the image sensor 108 by means of glue or adhesive 504.

According to the present invention, the microlens array 104 is directly bonded to the image sensor 108 using glue instead of a holder 502. The microlens array 104 is aligned with the image sensor 108 using six-axes alignment techniques, usually with submicronic precision, as described for instance in Châteauneuf et. al, "Six-degrees-of-freedom alignment technique that provides diagnostic misalignment information" (2004), and Brecher et al., "Flexure-Based 6-Axis Alignment Module for Automated Laser Assembly" (2010). FIGS. 8A-8F show a top view of the microlens array 104 attached to the image sensor 108 according to different ways of performing the gluing. The areas highlighted in grey represent the zones of the microlens array 104 that have been glued to the image sensor 108 using one or more glue drops and/or glue lines, a glue drop being discretely placed with no displacement of the injector during the glue application process, and a glue line being a dynamic glue application process following a pattern carried out by the relative movement of the dispenser over the surface, in this particular case the surface being the defined area of the image sensor.

In an embodiment, the microlens array 104 is directly bonded to the image sensor 108 with one or more glue drops 802 applied on at least one pair of opposite sides of the perimeter of the microlens array 104, wherein the perimeter is partially or fully included in the non-active area 404. In the case depicted in FIGS. 8A and 8B, four glue drops 802 are dispensed on opposite sides of the microlens array 104, two drops on each side.

Figure 8B:
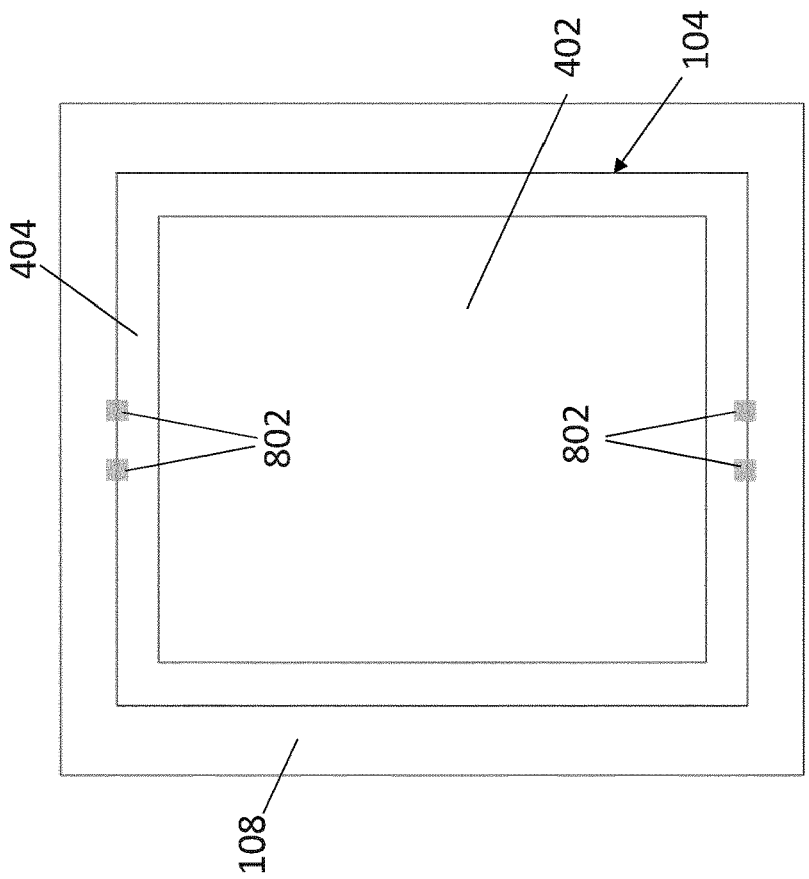
Figure 8A:
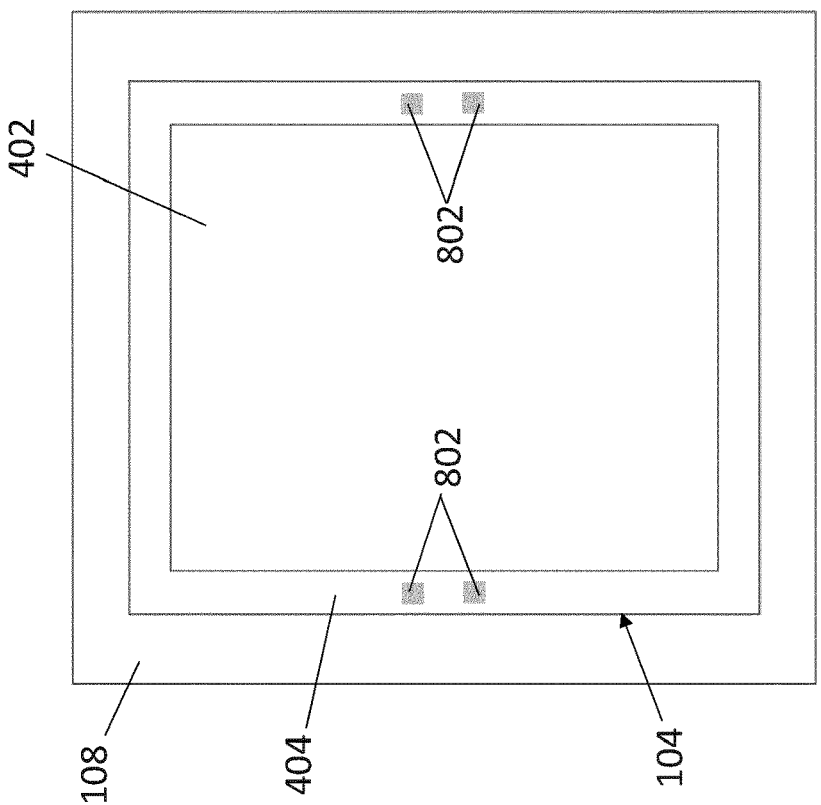
Figure 8C:
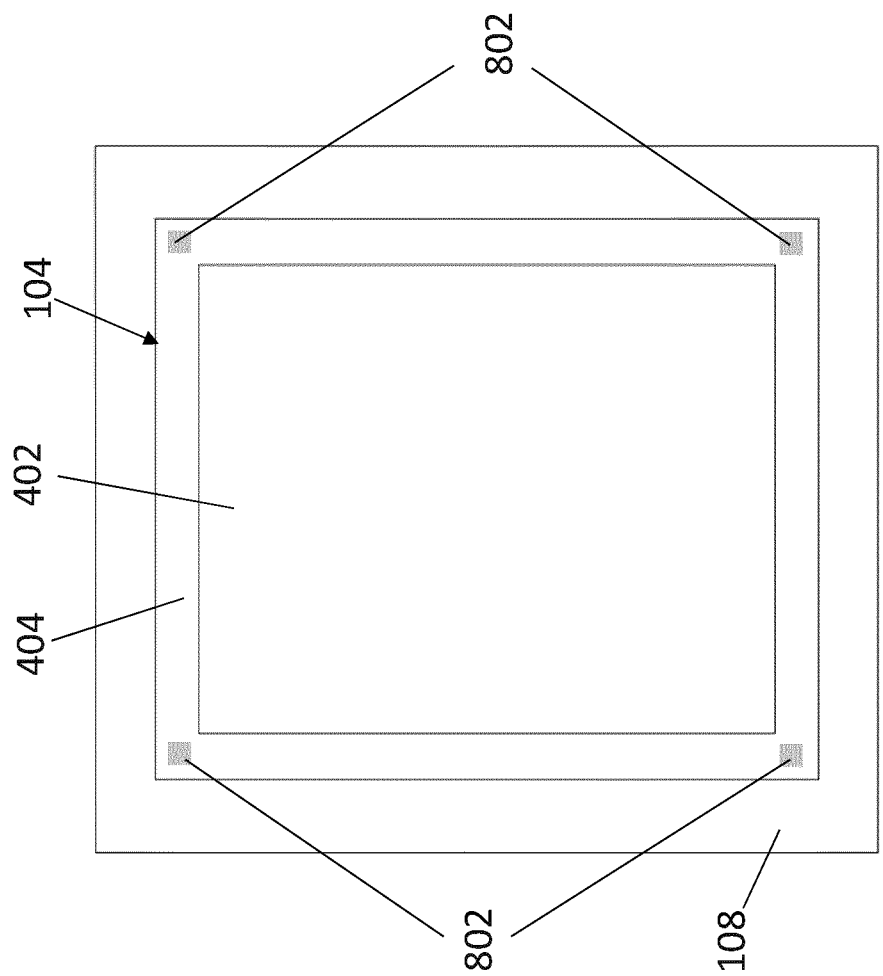
Figure 8F:
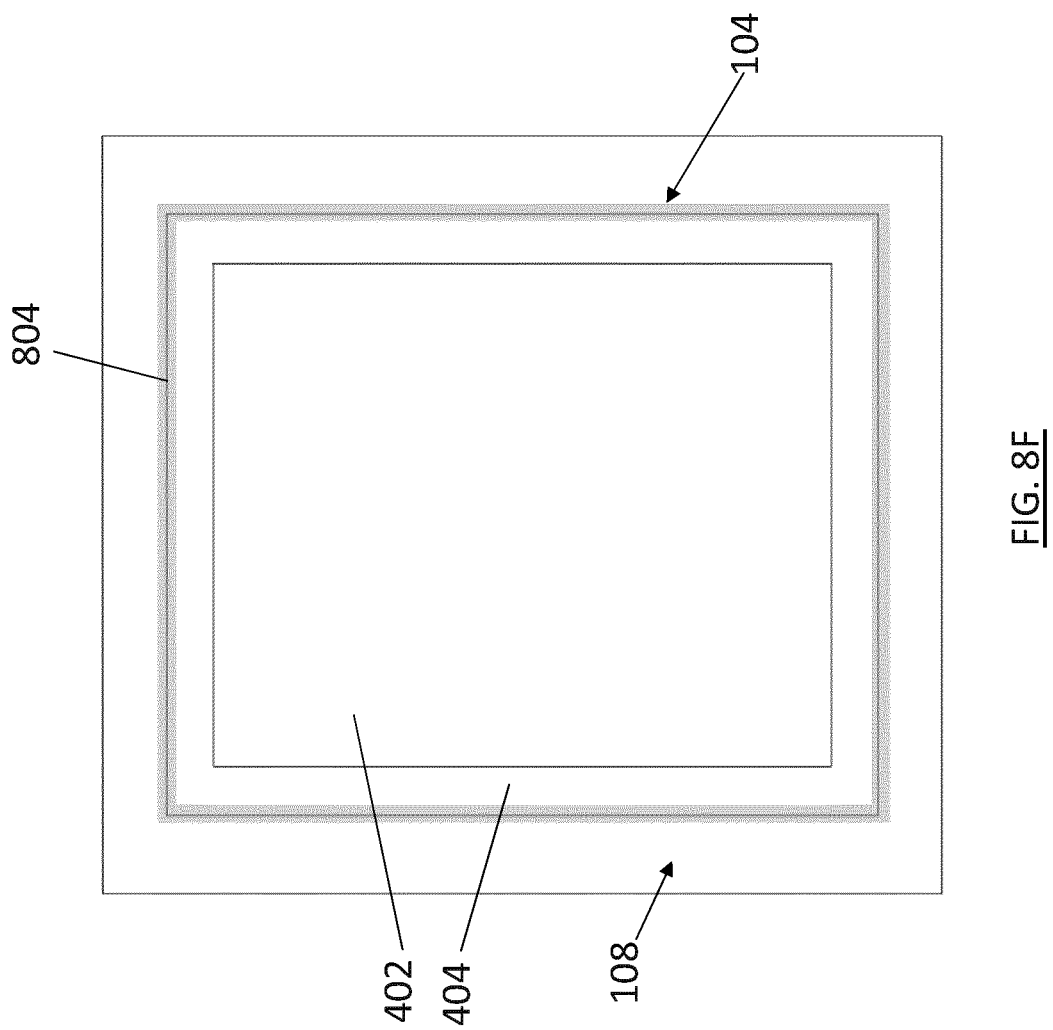

In the case of FIG. 8B, wherein the perimeter is partially included in the non-active area 404, the glue drops 802 can be deposited over the image sensor 108, over the microlens array 104 or dispensed at the air gap 114 between the microlens array 104 and the image sensor 108 after the microlens array 104 and the image sensor 108 have been already aligned at an appropriate distance.

In another embodiment, the microlens array 104 is directly bonded to the image sensor 108 with one or more glue drops 802 applied at each corner of the microlens array 104. In the example shown in FIG. 8C one glue drop 802 is applied at each corner of the microlens array 104.

The microlens array 104 may be directly bonded to the image sensor 108 with a plurality of glue lines 804 applied on at least part of the perimeter of the microlens array 104. The glue lines 804 are preferably applied on at least one pair of opposite sides of the perimeter of the microlens array 104. In the example represented in FIGS. 8D and 8E, two glue lines 804 are dispensed at the non-active area 404 of opposite sides of the microlens array 104 of the microlens array 104, one glue line on each one of these sides, leaving the other two sides of the microlens array 104 without glue. In the case depicted in FIG. 8F, four glue lines 804 are dispensed along the whole perimeter of the microlens array 104 within the air gap 114 between the microlens array 104 and the image sensor 108. The glue is dispensed from a side in the air gap 114 between the microlens array 104 and the sensor 108 once the microlens array 104 is in place and correctly aligned with the image sensor 108.

There are different ways of dispensing the glue:
Dispensed directly onto the non-active area 404 of the microlens array 104, before bringing it close to the image sensor 108.
Dispensed onto the image sensor 108.
Dispensed at the air gap 114 between both components when they are properly aligned.

Figure 9B:
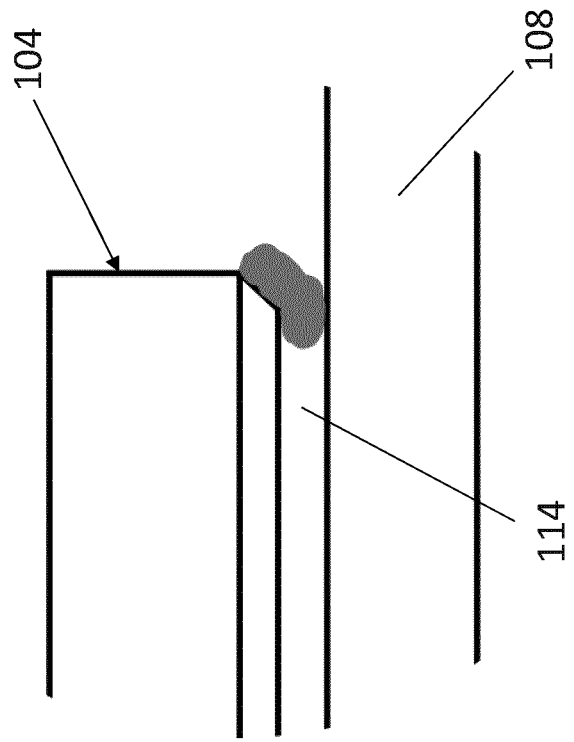
FIGS. 9A and 9B shows two different techniques for gluing the microlens array and the image sensor together.
Figure 9A:
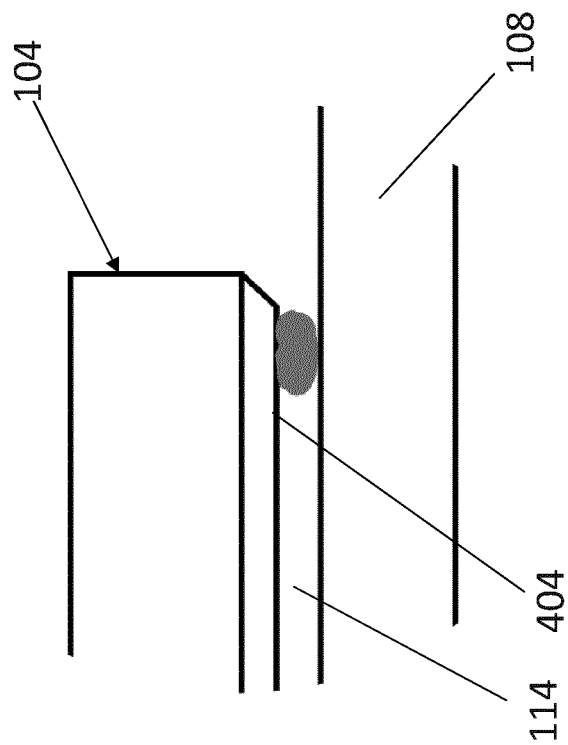

FIGS. 9A and 9B shows two ways of gluing the microlens array 104 to the image sensor 108. In the case of FIG. 9A, the glue (either glue drops 802 or glue lines 804) is applied directly over the non-active area 404 of the microlens array 104 before placing and aligning the microlens array 104, or directly over the non-active area of the image sensor 108 before placing the microlens array 104. In FIG. 9B, the glue is dispensed at the air gap 114 between the microlens array 104 and the image sensor 108 after they have been properly aligned.

The optical system of the present invention may also comprise a plurality of blocks (which may be implemented for instance as protrusions, columns or walls) for supporting the microlens array 104, thus helping in the gluing and/or the alignment process. The supporting blocks are arranged in the air gap 114 between the microlens array 104 and the image sensor 108, covering at least part of the perimeter of the microlens array 104, and support the microlens array 104 at the non-active area 404.

In the embodiment of FIG. 10A, showing a top and a front view of an arrangement comprising the microlens array 104 and the image sensor 108, the blocks 1002 are arranged at the corners of the microlens array 104. Alternatively, or in addition to, the blocks 1002 may be arranged at a middle section of each side of the perimeter of the microlens array 104, built as walls (FIG. 10B) or columns (FIG. 10C) over the non-active area 404 of the microlens array. The blocks 1002 help to perform the alignment of the microlens array 104 over the image sensor 108, and also avoid dispensing glue at the active optical area 402 of the microlens array 104 where the microlenses 106 are built. Besides, the blocks 1002 also help to reduce the effects of the warpage of the microlens array 104 produced by temperature changes.

The blocks 1002 can be built with the same material used for the microlenses. The presence of such blocks 1002 gives mechanical stability to the structure, helping to avoid misalignments. In this way, a better assembly of the tilts around the X-Y axes and the height of the microlens array 104 with respect to the image sensor 108 is ensured, because the blocks are built with the exact and appropriate height and they directly rest onto the image sensor 108. Besides, the microlens array 104 needs to be aligned in X, Y and yaw (rotation around Z axis) and glued to the image sensor 108. The gluing is performed using glue drops 802 or glue lines 804 as previously described.

FIG. 11A shows an example of a microlens array 104 attached to an image sensor 108, with blocks 1002 arranged at the corners of the microlens array 104, and glue drops 802 dispensed at opposite sides of the microlens array 104. FIG. 11B shows the case of a microlens array 104 attached to an image sensor 108 and blocks 1002 at the corners of the microlens array 104 and with glue lines 804 (or an equivalent distribution of glue) applied along the whole perimeter of the microlens array 104, except for the area at the corners occupied by the blocks 1002. These embodiments try to be illustrative but never limiting. With the combination of the supporting blocks 1002 and the direct gluing between the microlens array 104 and the image sensor 108, a better mechanical alignment is achieved.

The supporting blocks 1002 have another important purpose apart from easing the alignment techniques. The blocks 1002 contribute to keep the microlens array 104 and the image sensor 108 as parallel as possible. FIG. 12A depicts, in the upper image, an optical system 400 assuming that the warpage of the image sensor 108 and the microlens array 104 is negligible at room temperature, wherein the microlens array is bonded to the image sensor 108 following the scheme of FIG. 8A, and the image sensor 108 is bonded to the PCB 206 as in FIG. 6. When the temperature is increased (e.g. by applying heat), the image sensor 108 and microlens array 104 expand, and it may happen that the parallelism between both components is partially lost, as depicted in the lower image of FIG. 12A, since $d_1 \neq d_2$. As depicted in FIG. 12B, the inclusion of the blocks 1002 avoids (or at least minimizes) this lack of parallelism since the blocks 1002 contribute to keep $d_1$ substantially equal (or at least very close) to $d_2$, acting as a physical block, which makes the optical system 400 of the plenoptic camera work appropriately without the need of a large amount of calibration.

Figure 13A:
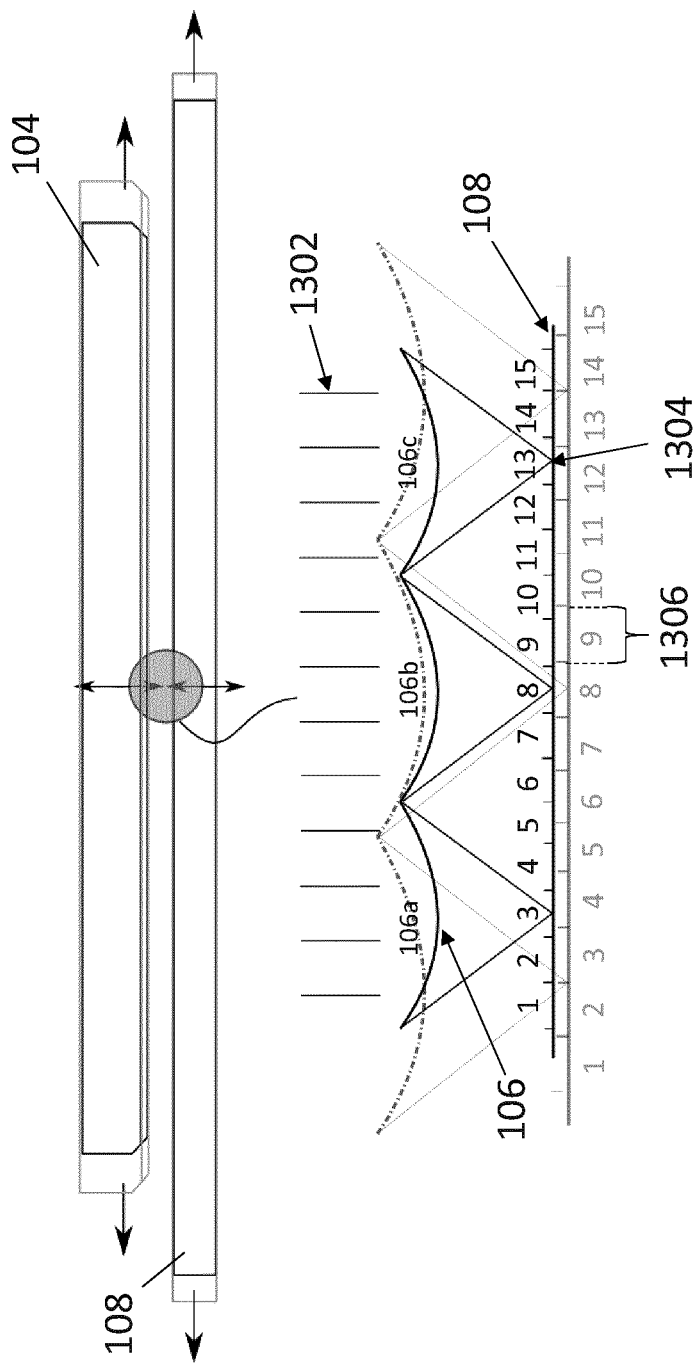
FIGS. 13A and 13B show the effect of the thermal expansion of the microlens array and the image sensor when both parts have very different coefficient of thermal expansion (FIG. 13A) or a similar or equal coefficient of thermal expansion and expand freely and harmonically (FIG. 13B).

When considering misalignments, it is important to consider the misalignments produced by a linear expansion of the components caused by a change in temperature. FIG. 13A depicts an example where the free thermal expansion occurs differently in the microlens array 104 and in the image sensor 108, that is due to the fact that both materials have very different coefficients of thermal expansion (CTE).

Figure 13B:
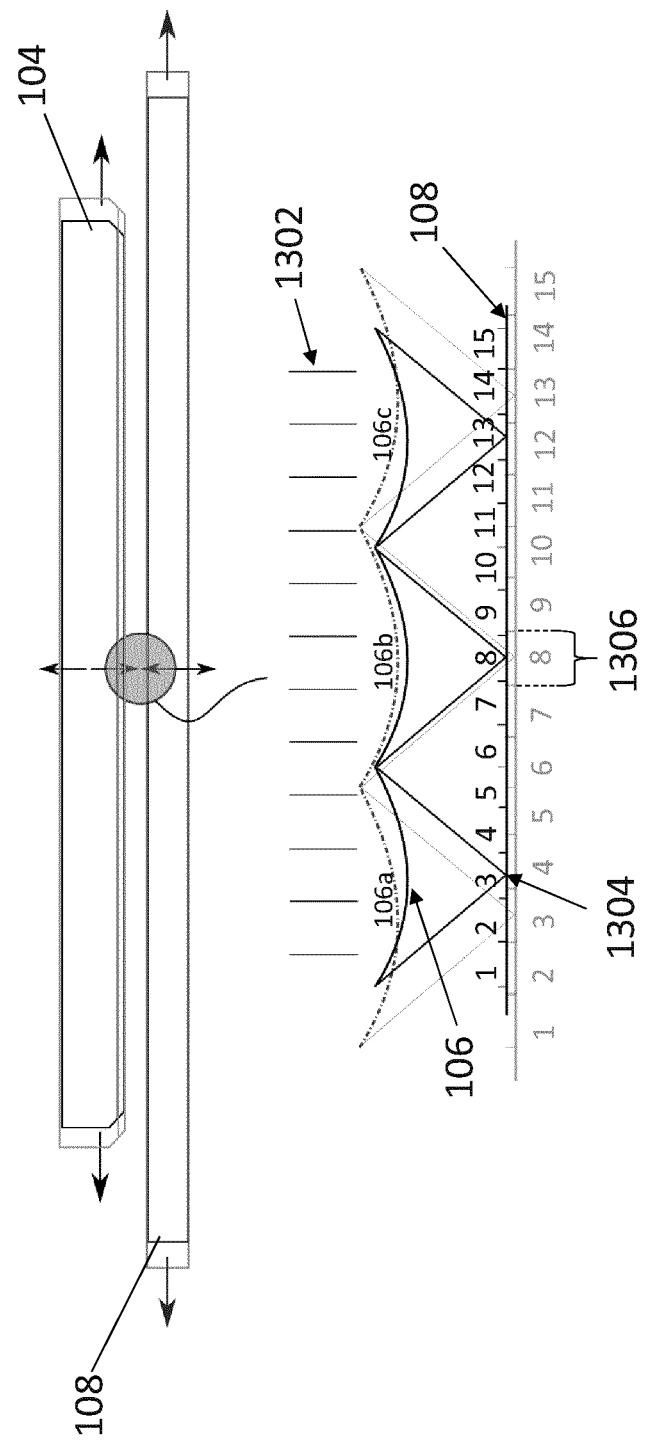
Figure 15A:
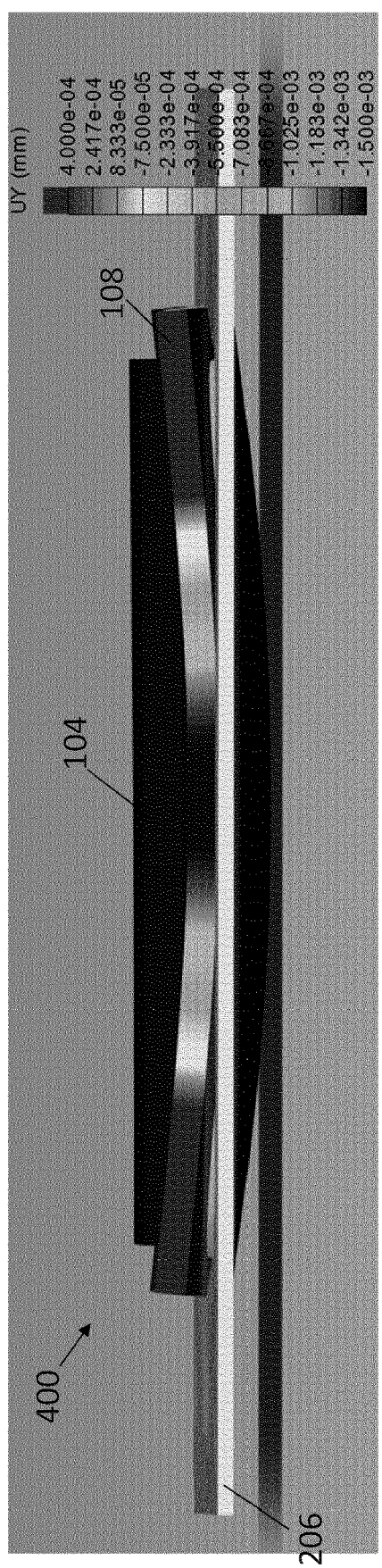
FIGS. 15A-15D show a front view of the simulation performed on an optical system where different gluing options between the microlens array and the image sensor are considered. In these four cases the image sensor and the PCB are attached following the pattern of FIG. 5.
Figure 15B:
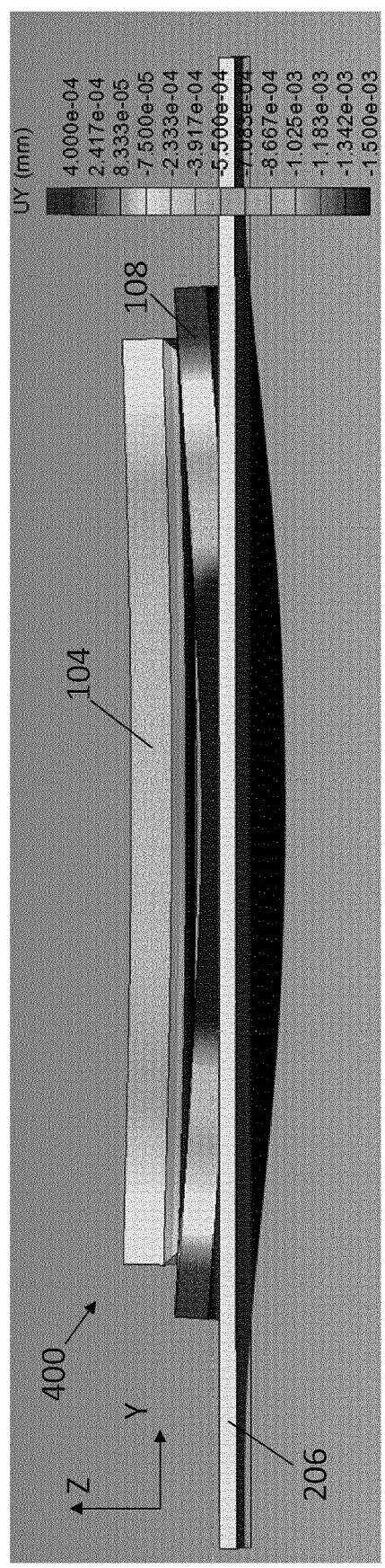
Figure 15C:
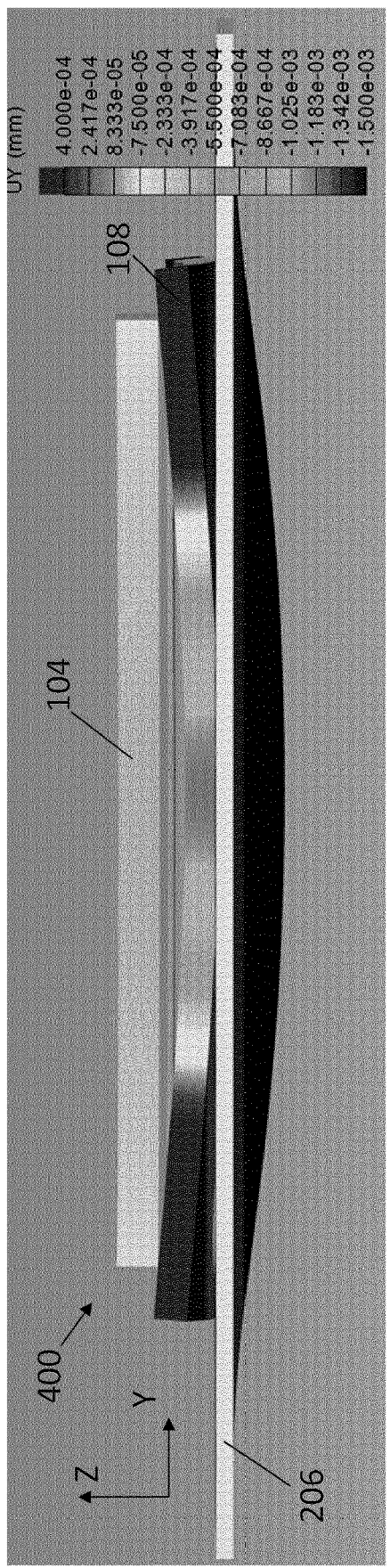
Figure 15D:
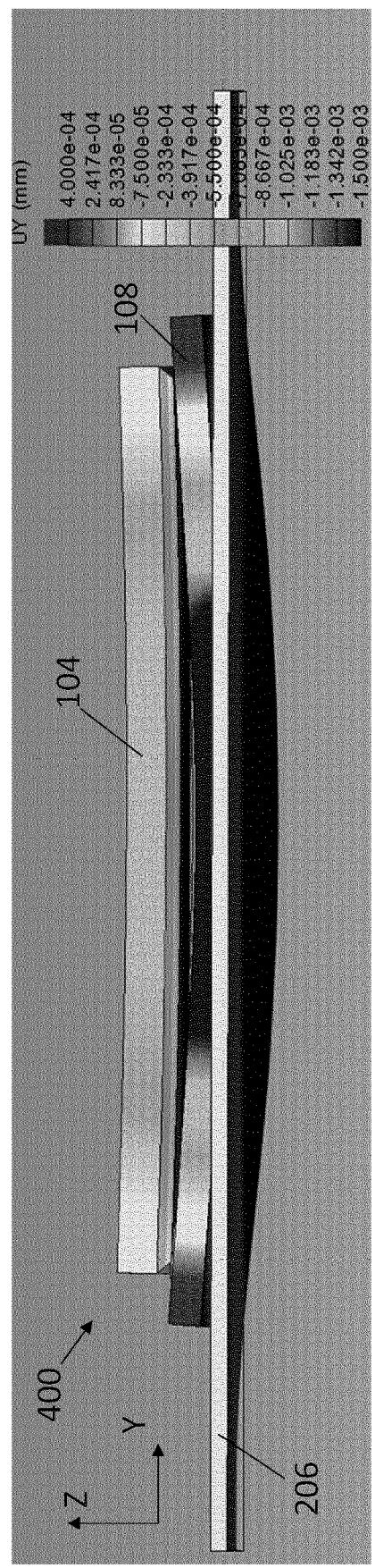
Figure 16A:
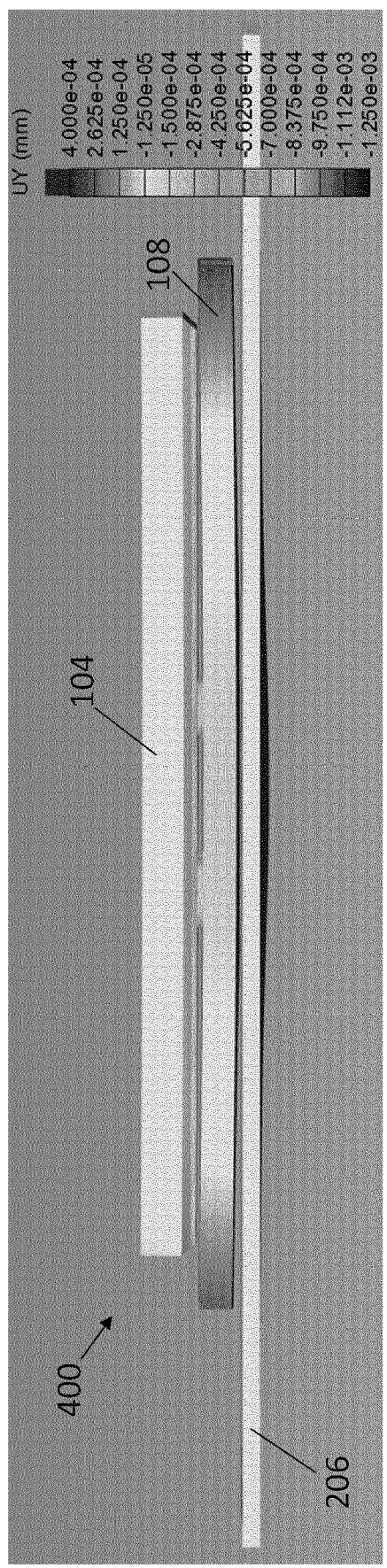
FIGS. 16A-16D show a front view of the simulation performed on an optical system where different gluing options between the microlens array and the image sensor are considered. In these four cases the image sensor and the PCB are attached following the pattern of FIG. 6.
Figure 16B:
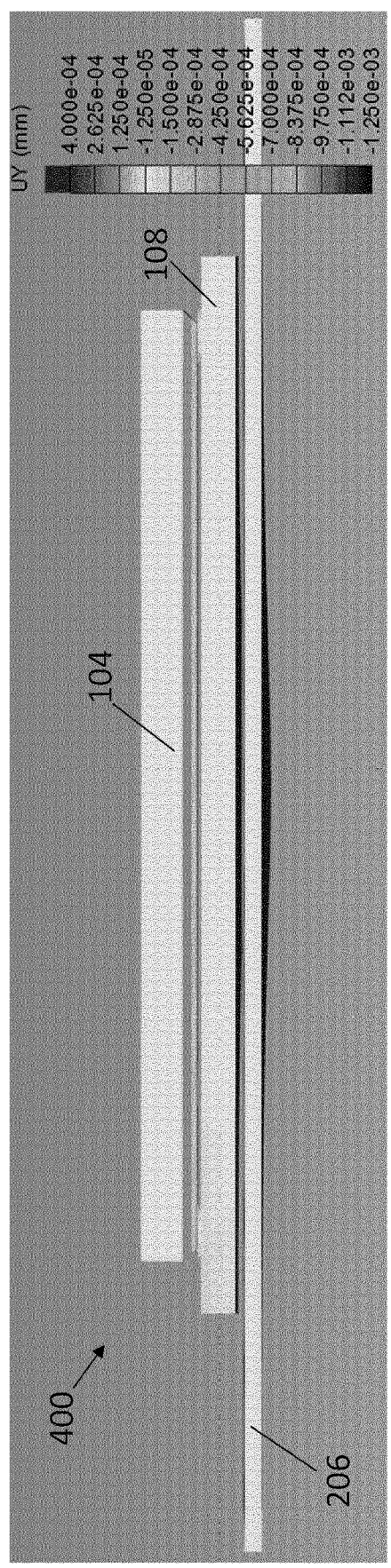
Figure 16C:
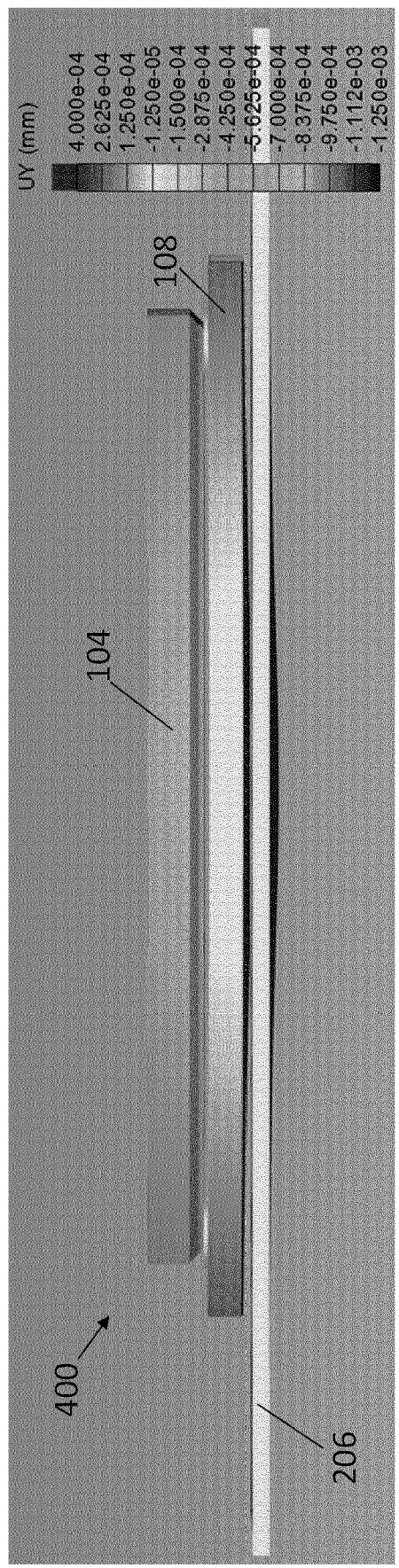
Figure 16D:
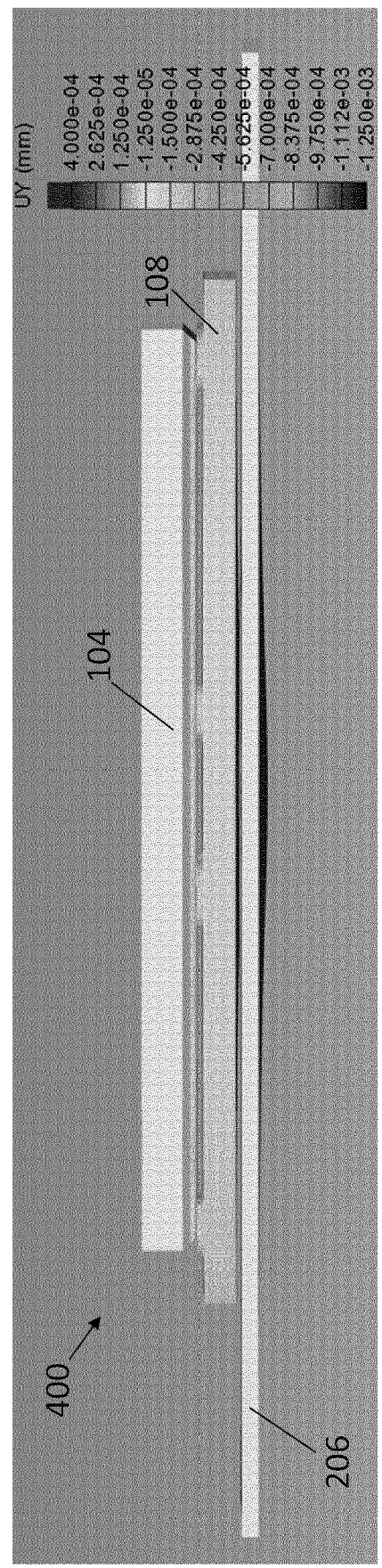

According to an embodiment, to minimize these misalignments the microlens array 104 comprises a glass substrate 302 made of a material with a CTE differing from the CTE of the image sensor 108 in less than $3 \cdot 10^{-6} K^{-1}$. FIG. 13B shows an example of the linear thermal expansion of the microlens array 104 and the image sensor 108 when both parts have a similar or equal CTE (a difference at least lower than $3 \cdot 10^{-6} K^{-1}$) and they expand freely and harmonically.

Considering the theoretical case in which both the image sensor 108 and the microlens array 104 (made in glass) do not suffer from any warpage at room temperature (20° C.) and they can expand freely, in order to avoid misalignments between the microlens array 104 and the image sensor 108, the glass substrate 302 in which the microlenses 106 are built shall be ideally a glass whose CTE matches the CTE of the image sensor 108. In this case, both components would expand exactly in the same way, keeping constant the relative positions between components. Finding a glass substrate 302 with exactly the same CTE as the image sensor 108 has not yet been possible. According to an embodiment, a glass substrate 302 with a maximum difference of $\Delta\alpha = |\alpha_1 \alpha_2| = 3 \times 10^{-6} K^{-1}$ is used, where $\alpha_1$ is the CTE of the image sensor 108 and $\alpha_2$ is the CTE of the glass substrate 302, trying to make $\Delta\alpha$ as small as possible. In an embodiment, AF32 is the material selected for the glass substrate 302. Both parts (image sensor 108 and glass substrate 302) have preferably the same thickness.

As already mentioned, the microlens array 104 is formed by a glass substrate 302 and the microlenses 106 themselves, which can be manufactured in the same glass as the glass substrate 302, or, for instance, built in polymer over glass. The polymers have a much higher CTE than the glasses and this may affect to the expansion of the microlens array itself causing warpages. However, the polymer is attached to the glass and the polymer thickness is at least five times smaller than the thickness of the glass. So, the expansion of the glass dominates the expansion of the whole microlens array 104. In any case, the polymer will also be considered in the thermal simulations explained in FIGS. 15 and 16, so that the warpage induced by the mismatch in CTE of the glass and the polymer is considered.

Considering (theoretically) that both the image sensor 108 and the microlens array 104 are made of a single material (silicon and glass), present no warpages and are parts not attached to other elements, FIGS. 13A and 13B show an example of the expansion of the image sensor 108 and the microlenses 104 when temperature is increased. Both the silicon-made sensor 108 and the glass-made microlens array 104 will expand according to their respective CTE (a) and will increase their size in the three space directions (x, y and z). When both parts expand harmonically (with the same or very similar CTE), the optical system still works properly, as the pixels of the image sensor expand in the same way as the microlenses do. In the case depicted in FIG. 13B, the microlens array 104 and the image sensor 108 have the same CTE, so the proportionality is kept. At the bottom part of FIG. 13B a zoom of the central zone of the microlens array 104 and the image sensor 108 is represented. The device is illuminated with collimated light 1302, so each microlens 106 in the microlens array 104 forms a spot 1304 over the image sensor 108. The spot 1304 will be in focus depending on the relative position between the microlens array 104 and the image sensor 108 and the microlenses focal length. In these figures, for simplicity, the spot 1304 is drawn in focus onto the image sensor 108, but this example does not intend to be limiting. Three microlenses (106a,106b,106c) are drawn in continuous black line (before thermal expansion)

and the same microlenses are drawn in dashed lines (after thermal expansion), as shown in the zoom of FIG. 13B. Fifteen pixels 1306 of the image sensor 108 are also drawn (in black before thermal expansion and in light grey after thermal expansion). As the expansion of the pixels 1306 is proportional to the expansion of the microlenses 106, each microlens 106 still focuses its spot 1304 on the same exact pixel position after the system is heated and thermally expanded. So, if the microlens 106b of the microlens array 104 concentrates the light onto the pixel number 8 in FIG. 13B after being heated or cooled, the optical system will expand or contract harmonically, and the microlens 106b will still focus its light in pixel number 8 after the thermal expansion. For the neighbouring microlenses (106a, 106c), which focus their spot in pixels number 3 and number 13 respectively, light will still be focused at the same pixels number 3 and number 13 after thermal expansion or contraction due to the thermal effects. And this will happen for all the microlenses 106, no matter the position of the field in which they are located, because the expansions of the image sensor 108 and the microlens array 104 are proportional.

In a light-field device such as a plenoptic camera, the microlenses position along the microlens array 104 is carefully designed and aligned so that each microlens 106 has its focus spot 1304 centered at a certain pixel 1306 of the image sensor 108. When the CTE of the microlens array 104 made all in glass ($\alpha_1$) and the CTE of the image sensor 108 ($\alpha_2$) are very different, they do not expand harmonically, losing the preferred design/alignment position of the microlens array 104 and the image sensor 108. This is represented in FIG. 13A. In the normal case, $\alpha_1 \gg \alpha_2$, the microlenses 106 expand more than the silicon. Therefore, the focus spot 1304 of each microlens 106 does not impinge onto the same pixel 1306 as the temperature changes, producing irregularities that are very difficult to calibrate as they depend on temperature. At the end, these mismatches in CTE will deteriorate the performance of the optical system. At room temperature, microlens 106b focuses its spot 1304 on pixel number 8, and its neighbouring microlenses (106a, 106c) focus the light at pixels number 3 and number 13, respectively. Once the optical system is heated, as the expansion of the microlens array 104 is different from the expansion of the image sensor 108, the preferred focus positions are lost. Microlens 106a focuses its spot 1304 between pixels number 2 and number 3 (instead of centered at pixel number 3 as in FIG. 13B), and microlens 106c focuses its spot 1304 between pixels number 13 and number 14 (instead of centered at pixel number 13 as in FIG. 13B).

The phenomenon described above about the different CTEs and the expansion of the microlens array 104 and the image sensor 108 considers both parts as two bulk materials and free non-attached parts. However, the image sensor 108 and the microlens array 104 need to be attached/bonded to each other. Besides, the image sensor 108 is glued to the PCB 206 or to a stiffener, which may lead to a non-flat sensor at the moment of gluing the microlens array 104 to the image sensor 108. As explained before, the attachment of the microlens array 104 and the image sensor 108 can be done by directly gluing the microlens array 104 onto the image sensor 108, dispensing the glue in the non-active area 404 of the microlens array 104, dispensing the glue in the image sensor 108, or dispensing the glue at the air gap 114 between the two components once they are in place.

In a preferred embodiment, the microlens array 104 is directly bonded to the image sensor 108 with a glue or adhesive. In this case, as it is difficult to ensure a good alignment in six axes, an active alignment needs to take place to avoid introducing mechanical misalignments that may ruin the performance of the camera, such as the one disclosed in U.S. Pat. No. 9,766,380-B2.

The present invention also considers the way of gluing the three components involved (namely, the microlens array 104, the image sensor 108 and the PCB 206), so the misalignments between the microlens array 104 and the image sensor 108 are drastically reduced. In an ideal situation, the three components would be attached one to each other with a small quantity of glue at the very center of each component, as illustrated in FIG. 14 in which the image sensor 108 is glued/attached to the PCB 206 with a small amount of glue (layer of adhesive material 502) which is placed in the geometrical center of the image sensor 108. In this case, although the image sensor 108 and the PCB 206 have different coefficient of thermal expansion, they can expand freely. The same occurs between the image sensor 108 and the microlens array 104. If they are attached with a small amount of glue 1402 at the very center of the microlens array 104, both components can expand freely. In a real situation, this cannot happen since gluing the microlens array 104 at its very center is not possible as it is an optical active area and no glue 1402 can interrupt the path of the light.

The present invention presents different techniques to avoid or minimize misalignments due to thermal effects, including different ways of gluing the microlens array 104 to the image sensor 108, the gluing of the image sensor 108 to the PCB 206 at its very center, the inclusion of supporting blocks 1002 between the microlens array 104 and the image sensor 108, and the selection of a material for the glass substrate 302 of the microlens array 104 with a particular CTE close to the CTE of the image sensor 108.

The glue or adhesive used to attach the microlens array 104 to the image sensor 108 and the adhesive used to bond together the image sensor 108 and the PCB/stiffener may be an ultraviolet-curable adhesive. For the attachment of the microlens array 104 to the image sensor 108 and the attachment of the image sensor 108 with the PCB/stiffener, either similar or different types of adhesive/glue can be used, depending on the desired characteristics of the final product. Preferably, the adhesive exhibits very low shrinkage during the curing process, so that it does not introduce high mechanical stresses that may induce misalignment between the microlens array 104 and the image sensor 108. Also, the glue is preferably thixotropic, so that it does not scatter all along the microlens array 104 when dispensed as glue drops 802 or glue lines 804 on the non-active area 404 of the microlens array 104 or directly onto the image sensor 108. Introducing fillers to the adhesive also gives mechanical stability and contributes to the low shrinkage of the glue.

The preferred way of gluing the microlens array 104 to the image sensor 108 is dependent on each particular optical system, which must be analyzed carefully to choose the most appropriate way so that warpage and sensitivity to temperature are reduced as much as possible. To that end, simulations of the optical system performance may be considered.

For the simulations of the different possibilities of gluing the microlens array 104 to the image sensor 108 (shown in FIGS. 8A-8F), both cases of FIGS. 5 and 6 will be considered. FIGS. 15 and 16 show a summary of all the simulated cases. In these figures, all the elements are defined as flat and not warped elements at room temperature (T=20° C.) and then the optical system is heated up to T=45° C. The deformation scale in the simulation is intensified by fifty times over the actual deformation, so that the deformation of the bodies is noticeable at a glance. The grey scale indicates the absolute displacement (UY in mm) of each point in the Y-axis direction with respect to the initial point (defined at T=20° C.).

FIGS. 15A-15D show, in a front view, the result of a simulation performed on an optical system 400 where the image sensor 108 is glued to the PCB 206 with a layer of adhesive material 502 covering the whole area of the image sensor 108, as depicted in FIG. 5. In all these cases the deformation is evident, due to the fact the image sensor 108 is completely glued to the PCB 206 and expands with the PCB, and as both materials have different CTE they suffer from deformations relative to each other during their expansion. In these figures the microlens array 104 is glued to the image sensor 108 according to different embodiments shown in FIGS. 8A-8F; in particular, FIG. 15A employs the gluing technique shown in FIG. 8A, FIG. 15B uses the embodiment of FIG. 8D, FIG. 15C the embodiment of FIG. 8C, and FIG. 15D the embodiment of FIG. 8F. In this case, the best result is achieved in the embodiment of FIG. 15D because the distance between the microlens array 104 and the image sensor 118 is kept as parallel as possible, although it is still warped.

FIGS. 16A-16D show a front view of an optical system 400 where the image sensor 108 is attached to the PCB 206 with a layer of adhesive material 502 only applied on a central region of the image sensor 108, as depicted in FIG. 6, on an area occupying around 10% of the total surface of the image sensor 108. In these embodiments the image sensor 108 has more freedom to expand without mechanical stress between image sensor 108 and PCB 206. In these figures the microlens array 104 is glued to the image sensor 108 according to different embodiments of FIGS. 8A-8F; in particular, FIG. 16A uses the gluing embodiment of FIG. 8A, FIG. 16B the embodiment of FIG. 8D, FIG. 16C the embodiment of FIG. 8C, and FIG. 16D the embodiment of FIG. 8F.

Gluing the image sensor 108 only by its center drastically reduces the misalignment between the image sensor 108 and the microlens array 104 when the optical system 400 is heated. Any of the embodiments of FIGS. 16A-16D is a better option than the embodiments of FIGS. 15A-15D due to this reason. Embodiments of FIGS. 16A-16D are therefore preferred embodiments, as they lead to less warpages and more parallelism between the image sensor 108 and the microlens array 104, as can be seen in the UY deformation scale.

Figure 17A:
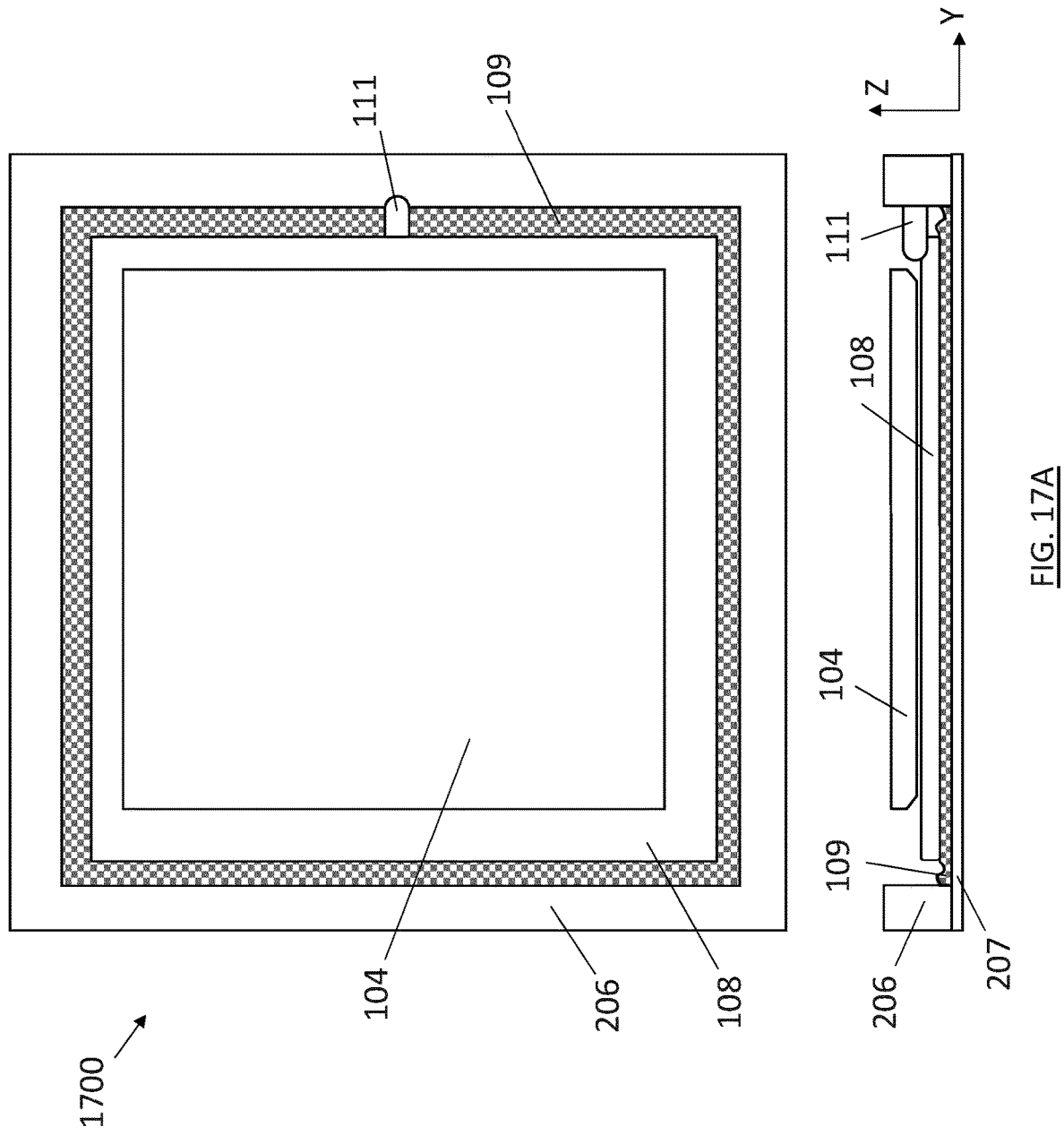
FIG. 17A shows another embodiment in which a thin layer of thermally conductive resin is applied between the base of the sensor and a stiffener attached to the PCB, and a glue drop is placed on a single side of the sensor, more precisely in a side gap between the image sensor and the PCB.

FIG. 17A shows top and front views of another embodiment of the optical system 1700 in which the image sensor 108 and the microlens array 104 are kept in an invariable position on the Y-X axes. A resin layer 109 is laid between the base of the image sensor 108 and the PCB 206, or between the base of the image sensor 108 and a stiffener 207 attached to the PCB 206, when a stiffener for the PCB is employed (as in the embodiment depicted in FIG. 17A). The resin layer 109 is preferably thermally conductive, which makes it easier to evacuate the heat generated by the system and contributes to the minimization of thermal expansions and contractions, leading to fewer defects during the useful life of the system. The image sensor 108 is placed over the resin layer 109, and the microlens array 104 is in turn placed on top of the image sensor 108. The microlens array 104 is directly bonded to the image sensor 108 with one or more glue drops 802 or glue lines 804, as explained in the previous embodiments.

To keep the image sensor 108 and microlens array 104 aligned on the X-Y axes with minimal mechanical stress caused by other camera elements like the PCB 206 or the stiffener 207, a glue drop 111 is placed on a single side of the image sensor 108 and stuck to the PCB 206. The glue drop 111 is made preferably of an elastic glue. The glue drop 111 works as an anchor, keeping the image sensor 108 and microlens array 104 on the same relative X-Y position due to this tethering point and the absence of mechanical stress enabled by the resin layer 109 over the PCB/stiffener. The lateral protrusions of the PCB 206 are the result of an etching process applied on the PCB 206, in which part of its thickness is removed in a localized area, leaving the edge of the PCB 206 surrounding the image sensor 108. The image sensor 108 is located between the lateral protrusions of the PCB 206 so that the optical system, and the corresponding camera assembly, is more compact in height.

Figure 17B:
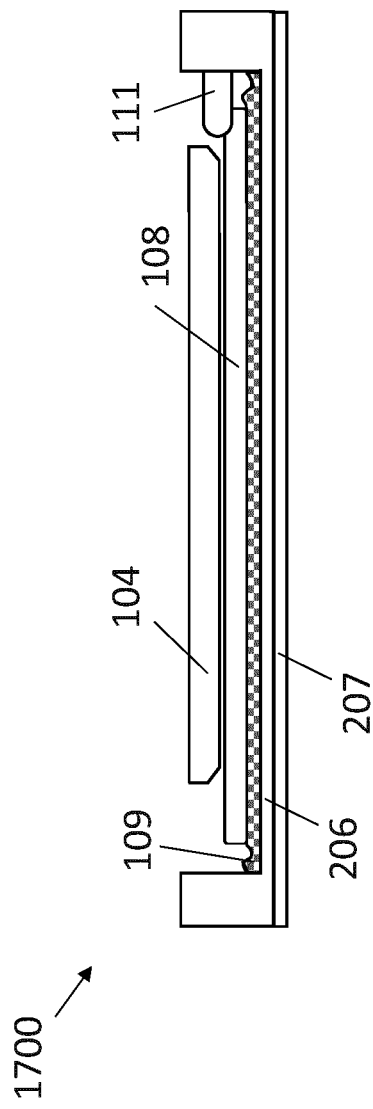
FIGS. 17B and 17C show different embodiments with or without a stiffener.
Figure 17C:
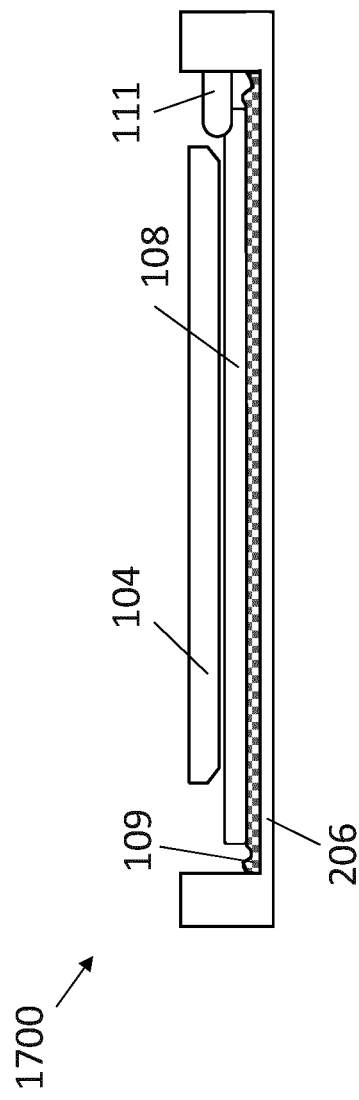

In the example of FIG. 17A, after the etching process the central region of the PCB completely disappears and only the lateral protrusions of the PCB 206 remain. In another embodiment, as depicted in FIG. 17B, the thickness of the central region is reduced but not completely eliminated during the etching process. In this case, the resin layer 109 lays between the base of the image sensor 108 and the PCB 206, and the stiffener 207 is attached to the base of the PCB 206 to provide stiffness or mechanical rigidity to the set. In yet another embodiment, as shown in FIG. 17C, the resin layer 109 lays between the base of the image sensor 108 and the PCB 206, whilst a stiffener 207 is not used in this case.

Figure 18:
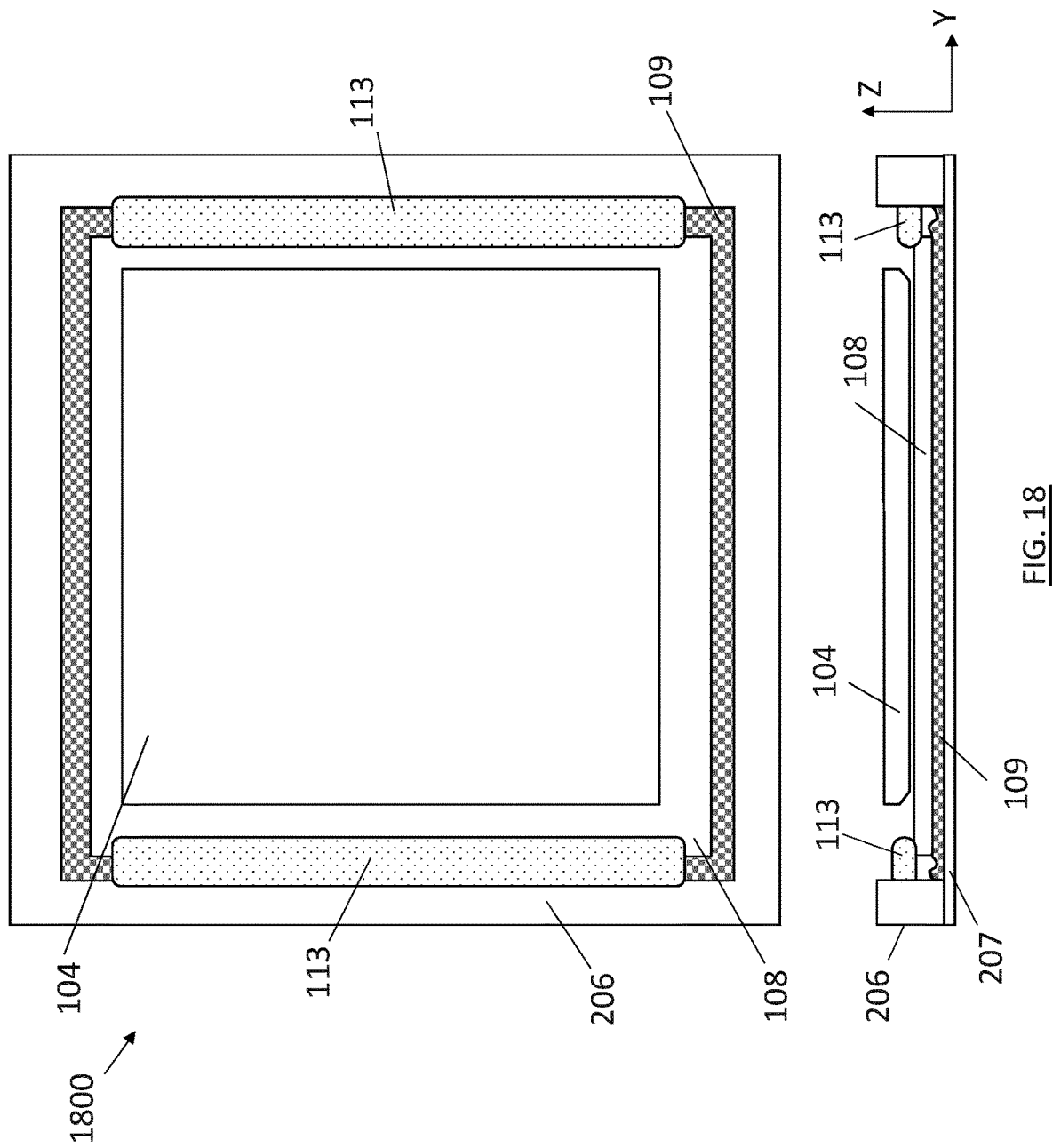
FIG. 18 shows an embodiment similar to the one depicted in FIG. 17A, in which the glue drop disposed on a single side of the sensor is replaced with glue lines disposed at opposite sides of the image sensor.

FIG. 18 shows top and lateral views of another embodiment of the optical system 1800, which corresponds to the optical system shown in FIG. 17A, the only difference being that instead of the glue drop 111 disposed on a single lateral side of the image sensor 108, in this particular case two or more glue lines 113 are arranged at opposite lateral sides of the image sensor 108. To keep the image sensor 108 and microlens array 104 aligned on the X-Y axes and not warped by mechanical stresses from the PCB 206 or the stiffener 207, two glue lines 113 are placed at opposite sides of the image sensor 108 and stuck to the PCB 206. The glue lines 113 are preferably made of elastic glue. The glue lines 113 help keeping the image sensor 108 and microlens array 104 on the same relative X-Y position due to the mechanical fixation of these tethering lines and their ability to physically absorb the dimensional variations caused by temperature changes and the different CTEs of the PCB 206 and/or the stiffener 207. The resin layer 109 allows for a stressless expansion and contraction of the PCB 206 and/or the stiffener 207 below the image sensor 108 while causing no warpage to the sensor. The use of the two glue lines 113 instead of the single glue drop 111 can also be applied to the embodiments shown in FIGS. 17B and 17C.

Figure 19A:
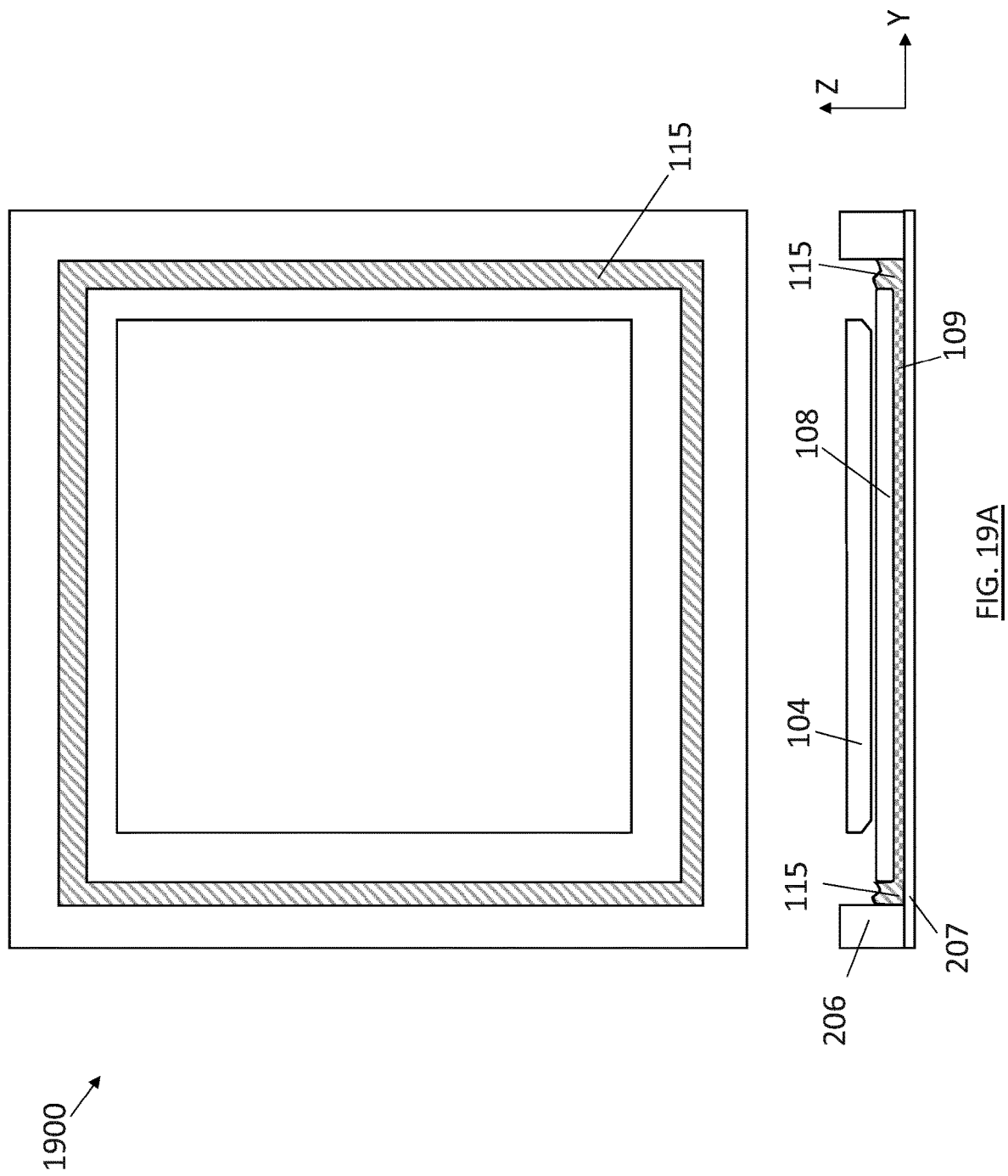
FIG. 19A shows a different solution to keep the image sensor attached to the stiffener and the PCB, in which a thin layer of thermally conductive resin is placed between the base of the sensor and a stiffener attached to the PCB, and an elastic adhesive layer is applied around the perimeter gap between the PCB and the image sensor.

The embodiment depicted in FIG. 19A shows top and front views of an optical system 1900 designed to keep the image sensor 108 and the microlens array 104 in an invariable position on the Y-X axes and minimizing the warps caused by PCB 206 or stiffener 207. The microlens array 104 is bonded to the image sensor 108 according to any of the previously explained embodiments. A resin layer 109 is laid between the base of the image sensor 108 and the PCB 206, or between the base of the image sensor 108 and a stiffener 207 attached to the PCB 206, when a stiffener is used (as in the embodiment depicted in FIG. 19A). An elastic adhesive layer 115 is laid on the perimeter gap between the image sensor 108 and the PCB 206, so that the side walls of the image sensor 108 are covered by the elastic adhesive layer 115.

The resin layer 109 and the adhesive layer 115 are preferably thermally conductive, providing greater stability to the system and minimizing the impact caused by an increase in temperature on the different elements of the system. Thus, all faces of the image sensor 108, except the top one and the base, are surrounded by the adhesive layer 115, and none of these lateral faces are in direct contact with the PCB 206 and/or stiffener 207 which exhibit very different CTEs. In this embodiment, the image sensor 108 and the microlens array 104 manage to keep their relative position on the X-Y coordinates by allowing the results of the mechanical stresses created by the contraction and expansion of the PCB 206 and/or stiffener 207 over the image sensor 108 to be cancelled by the elasticity of the adhesive layer 115, which preferably has a high elastic modulus.

In the embodiment depicted in FIG. 19B, the thickness of the central region of the PCB 206 is reduced but not completely eliminated during the etching process, so that the resin layer 109 lays between the base of the image sensor 108 and the PCB 206, the stiffener 207 being placed below the PCB 206. In the embodiment of FIG. 19C, a stiffener 207 is not employed.

Figure 4B:
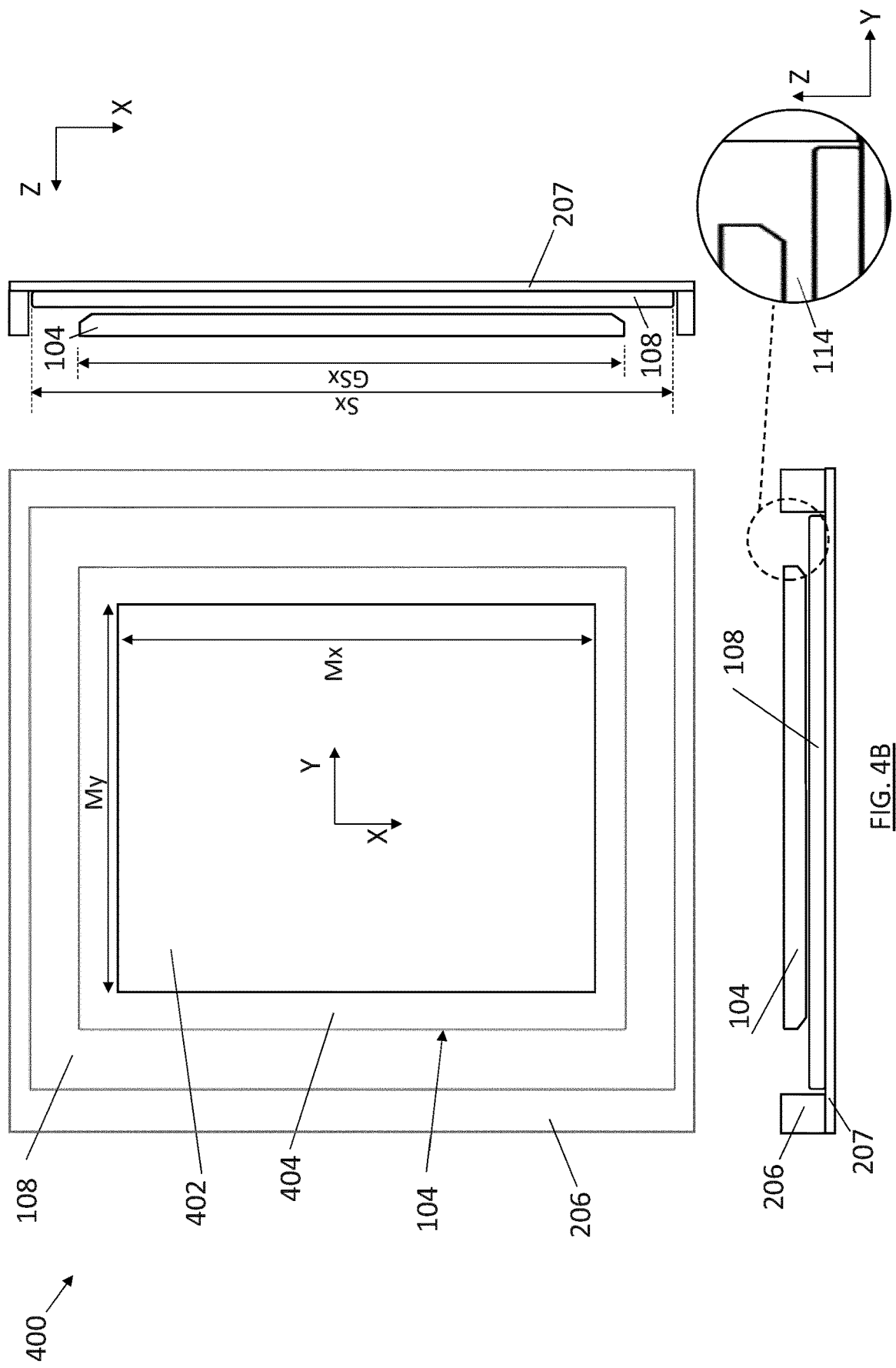

Similar arrangements of the PCB and/or stiffener in the etching process may be applied to the embodiment of FIG. 4B (e.g. the image sensor 108 may be directly glued to an etched central region of the PCB 206, the stiffener 207 being attached to the base of the PCB 206).

As a summary, in a plenoptic camera 100 the relative position between the microlens array 104 and the image sensor 108 is fundamental. If these two elements are kept parallel and at a certain distance regardless from temperature variations, the camera will work properly without the need of big amounts of calibration information. The present invention refer to several gluing techniques, a selection of the material of the glass substrate of the microlens array with a particular CTE, and the inclusion of physical blocks in the microlens array which, when combined (e.g. as in the embodiments of FIGS. 11 and 12), synergistically contribute to the correct alignment between the microlens array 104 and the image sensor 108, achieving a robust system as non-sensitive as possible to the temperature.

The invention claimed is:

1. An optical system comprising a microlens array (104), an image sensor (108) and a printed circuit board (206), wherein the microlens array (104) is directly glued to the image sensor (108), wherein the system (1700, 1800, 1900) comprises a resin layer (109) placed, but not glued, between the base of the image sensor (108) and one of the following:
    the printed circuit board (206),
    a stiffener (207) attached to the printed circuit board (206), or
    the printed circuit board with a stiffener attached at its bottom;
and wherein the image sensor (108) is bonded to the printed circuit board (206) with at least one glue drop (111) or line (113) or with an elastic adhesive material (115) applied on at least one of the lateral sides of the image sensor (108).

2. The optical system of claim 1, wherein the at least one glue drop (111) or line (113) is made of an elastic adhesive material.

3. The optical system of claim 1, wherein the image sensor (108) is bonded to the printed circuit board (206) with a glue drop (111) applied on a single lateral side of the image sensor (108).

4. The optical system of claim 1, wherein the image sensor (108) is bonded to the printed circuit board (206) with a plurality of glue drops (111) or glue lines (113) applied on a plurality of lateral sides of the image sensor (108).

5. The optical system of claim 4, wherein the image sensor (108) is bonded to the printed circuit board (206) with glue lines (113) applied on opposite lateral sides of the image sensor (108).

6. The optical system of claim 1, wherein the image sensor (108) is bonded to the printed circuit board (206) with an elastic adhesive layer (115) applied on all the lateral sides of the image sensor (108).

7. The optical system of claim 1, wherein the resin layer (109) is thermally conductive.

8. The optical system of claim 1, wherein the microlens array (104) is directly bonded to the image sensor (108) with one or more glue drops (802) or glue lines (804).

9. The optical system of claim 8, wherein the microlens array (104) is directly bonded to the image sensor (108) with one or more glue drops (802) applied on at least one pair of opposite sides of the perimeter of the microlens array (104).

10. The optical system of claim 8, wherein the microlens array (104) is directly bonded to the image sensor (108) with one or more glue drops (802) applied at the corners of the microlens array (104).

11. The optical system of claim 8, wherein the microlens array (104) is directly bonded to the image sensor (108) with a plurality of glue lines (804) applied on at least part of the perimeter of the microlens array (104).

12. The optical system of claim 11, wherein the glue lines (804) are applied on at least one pair of opposite sides of the perimeter of the microlens array (104).

13. The optical system of claim 1, wherein the adhesive material (502; 802; 804; 111; 113; 115) employed in the system (400; 1700; 1800; 1900) is thermally conductive.

14. The optical system of claim 1, further comprising a plurality of blocks (1002) for supporting the microlens array (104).

15. The optical system of claim 14, wherein the blocks (1002) are arranged at the corners of the microlens array (104).

16. The optical system of claim 14, wherein the blocks (1002) are arranged at a middle section of each side of the perimeter of the microlens array (104).

17. The optical system of claim 1, wherein the microlens array (104) comprises a glass substrate (302) made of a material with a coefficient of thermal expansion differing from the coefficient of thermal expansion of the image sensor (108) in less than $3 \cdot 10^{-6} K^{-1}$.

18. The optical system of claim 17, wherein the material of the glass substrate (302) is AF32.

19. A plenoptic camera for portable devices, wherein the plenoptic camera comprises the optical system (400; 1700; 1800; 1900) of claim 1.

* * * * *